(12) United States Patent
Koos et al.

(10) Patent No.: US 7,531,463 B2
(45) Date of Patent: *May 12, 2009

(54) FABRICATION OF SEMICONDUCTOR INTERCONNECT STRUCTURE

(75) Inventors: Daniel A. Koos, Portland, OR (US); Steven T. Mayer, Lake Oswego, OR (US); Heung L. Park, Wilsonville, OR (US); Timothy Patrick Cleary, Portland, OR (US); Thomas Mountsier, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/586,394

(22) Filed: Oct. 24, 2006

(65) Prior Publication Data

US 2007/0105377 A1 May 10, 2007

Related U.S. Application Data

(63) Continuation-in-part of application No. 10/690,084, filed on Oct. 20, 2003, now Pat. No. 7,338,908, and a continuation-in-part of application No. 10/742,006, filed on Dec. 18, 2003, now abandoned, which is a continuation-in-part of application No. 10/690,084, filed on Oct. 20, 2003, now Pat. No. 7,338,908.

(51) Int. Cl.
*H01L 21/302* (2006.01)

(52) U.S. Cl. .......................... 438/754; 438/745; 438/753

(58) Field of Classification Search .................. 438/692, 438/693, 745, 750, 641, 678, 754, 751, 753, 438/752; 216/102, 106
See application file for complete search history.

(56) References Cited

U.S. PATENT DOCUMENTS 4,002,778 A 1/1977 Bellis et al.

(Continued)

FOREIGN PATENT DOCUMENTS

JP 03122266 5/1991

OTHER PUBLICATIONS

Aksu et al., "The Role of Glycine in the Chemical Mechanical Planarizating of Copper," Journal of The Electrochemical Society, 149 (6) G352-G361 (2002), Department of Materials Science and Engineering, University of California, Berkeley, Berkeley, California 94720-1760, USA.

(Continued)

*Primary Examiner*—Lan Vinh
(74) *Attorney, Agent, or Firm*—Weaver Austin Villeneuve & Sampson LLP

(57) ABSTRACT

An etching process for selectively etching exposed metal surfaces of a substrate and forming a conductive capping layer over the metal surfaces is described. In some embodiments, the etching process involves oxidation of the exposed metal to form a metal oxide that is subsequently removed from the surface of the substrate. The exposed metal may be oxidized by using solutions containing oxidizing agents such as peroxides or by using oxidizing gases such as those containing oxygen or ozone. The metal oxide produced is then removed using suitable metal oxide etching agents such as glycine. The oxidation and etching may occur in the same solution. In other embodiments, the exposed metal is directly etched without forming a metal oxide. Suitable direct metal etching agents include any number of acidic solutions. The process allows for controlled oxidation and/or etching with reduced pitting. After the metal regions are etched and recessed in the substrate surface, a conductive capping layer is formed using electroless deposition over the recessed exposed metal regions.

30 Claims, 9 Drawing Sheets

U.S. PATENT DOCUMENTS

| | | | | |
|---|---|---|---|---|
| 4,181,760 | A | * | 1/1980 | Feldstein ............... 427/99.1 |
| 4,311,551 | A | * | 1/1982 | Sykes ..................... 216/92 |
| 4,737,446 | A | | 4/1988 | Cohen et al. |
| 4,981,725 | A | | 1/1991 | Nuzzi et al. |
| 5,151,168 | A | | 9/1992 | Gilton et al. |
| 5,318,803 | A | | 6/1994 | Bickford et al. |
| 5,380,560 | A | | 1/1995 | Kaja et al. |
| 5,382,447 | A | | 1/1995 | Kaja et al. |
| 5,486,234 | A | | 1/1996 | Contolini et al. |
| 5,576,052 | A | | 11/1996 | Arledge et al. |
| 5,674,787 | A | | 10/1997 | Zhao et al. |
| 5,695,810 | A | | 12/1997 | Dubin et al. |
| 5,770,095 | A | * | 6/1998 | Sasaki et al. ............... 216/38 |
| 5,824,599 | A | | 10/1998 | Schacham-Diamand et al. |
| 5,891,513 | A | | 4/1999 | Dubin et al. |
| 5,897,375 | A | | 4/1999 | Watts et al. |
| 5,913,147 | A | | 6/1999 | Dubin et al. |
| 5,969,422 | A | | 10/1999 | Ting et al. |
| 5,972,192 | A | | 10/1999 | Dubin et al. |
| 6,065,424 | A | | 5/2000 | Shacham-Diamand et al. |
| 6,136,707 | A | | 10/2000 | Cohen |
| 6,174,353 | B1 | | 1/2001 | Yuan et al. |
| 6,184,124 | B1 | | 2/2001 | Hasegawa et al. |
| 6,197,181 | B1 | | 3/2001 | Chen |
| 6,197,364 | B1 | | 3/2001 | Paunovic et al. |
| 6,309,981 | B1 | | 10/2001 | Mayer et al. |
| 6,329,284 | B2 | | 12/2001 | Maekawa |
| 6,342,733 | B1 | | 1/2002 | Hu et al. |
| 6,355,153 | B1 | * | 3/2002 | Uzoh et al. ............... 205/87 |
| 6,398,855 | B1 | | 6/2002 | Palmans et al. |
| 6,537,416 | B1 | | 3/2003 | Mayer et al. |
| 6,586,342 | B1 | | 7/2003 | Mayer et al. |
| 6,645,567 | B2 | * | 11/2003 | Chebiam et al. ........ 427/443.1 |
| 6,664,122 | B1 | | 12/2003 | Andryuschenko et al. |
| 6,692,546 | B2 | * | 2/2004 | Ma et al. ................. 51/298 |
| 6,713,122 | B1 | | 3/2004 | Mayer et al. |
| 6,716,753 | B1 | * | 4/2004 | Shue et al. ............... 438/687 |
| 6,776,907 | B2 | | 8/2004 | Boyko et al. |
| 6,815,349 | B1 | | 11/2004 | Minshall et al. |
| 6,884,724 | B2 | | 4/2005 | Hsu et al. |
| 6,887,776 | B2 | | 5/2005 | Shang et al. |
| 6,962,873 | B1 | | 11/2005 | Park |
| 6,975,032 | B2 | | 12/2005 | Chen et al. |
| 7,008,871 | B2 | * | 3/2006 | Andricacos et al. ........ 438/652 |
| 7,049,234 | B2 | | 5/2006 | Cheng et al. |
| 7,056,648 | B2 | | 6/2006 | Cooper et al. |
| 7,262,504 | B2 | | 8/2007 | Cheng et al. |
| 7,285,494 | B2 | | 10/2007 | Cheng et al. |
| 2001/0038448 | A1 | * | 11/2001 | Jun et al. ............... 356/237.4 |
| 2002/0084529 | A1 | | 7/2002 | Dubin et al. |
| 2003/0003711 | A1 | * | 1/2003 | Modak ................... 438/629 |
| 2003/0057526 | A1 | | 3/2003 | Chung et al. |
| 2003/0059538 | A1 | | 3/2003 | Chung et al. |
| 2003/0075808 | A1 | | 4/2003 | Inoue et al. |
| 2003/0176049 | A1 | | 9/2003 | Hegde et al. |
| 2003/0190426 | A1 | | 10/2003 | Padhi et al. |
| 2004/0065540 | A1 | | 4/2004 | Mayer et al. |
| 2004/0253740 | A1 | | 12/2004 | Shalyt et al. |
| 2005/0074967 | A1 | * | 4/2005 | Kondo et al. ........... 438/630 |
| 2005/0158985 | A1 | | 7/2005 | Chen et al. |
| 2005/0250339 | A1 | | 11/2005 | Shea et al. |
| 2005/0266265 | A1 | | 12/2005 | Cheng et al. |
| 2006/0205204 | A1 | | 9/2006 | Beck |

OTHER PUBLICATIONS

U.S. Office Action mailed Jan. 23, 2007, from U.S. Appl. No. 11/251,353.

Andryuschenko et al., "Electroless and Electrolytic Seed Repair Effects on Damascene Feature Fill," Proceedings of International Interconnect Tech. Conf., San Francisco Ca., Jun. 4-6, 2001, pp. 33-35.

Chen et al., "ECD Seed Layer for Inlaid Copper Metallisation," Semiconductior Fabtech—12$^{th}$ Edition, 5 Pages, Jul. 2000.

Ken M. Takahashi, "Electroplating Copper into Resistive Barrier Films," Journal of the Electrochemical Society, 147 (4) 1417-1417 (2000).

T.P. Moffat et al., "Superconformal Electrodeposition of Copper in 500-90 nm Features," Journal of the Electrochemical Society, 147 (12) 4524-4535 (2000).

Ritzdorf et al., "Electrochemically Deposited Copper," Conference Proceedings ULSI XV 2000, Materials Research Society, 101-107.

Reid et al., "Optimization of Damascene Feature Fill for Copper Electroplating Process," Shipley Company, IITC 1999, 3 Pages.

Reid et al., "Copper PVD and Electroplating," Solid State Technology, Jul. 2000, www.solid-state.com, 86-103.

Reid et al., "Factors Influencing Fill of IC Features Using Electroplated Copper," Adv Met Conf Proc 1999, MRS 10 Pages, (2000).

Shacham-Diamond et al., "Copper Electroless Deposition Technology for Ultr-Large-Scale-Integration (ULSI) Metallization," Microelectronic Engineering 33 (1997) 47-58.

Hu et al., "Effects of Overlayers on Electromigration Reliability Improvement for Cu/Low K Interconnects," Presented in the Proceedings of the 42$^{nd}$ Annual IRPS held Apr. 25-29, 2004, p. v, article published May 28, 2004, 7 Pages.

Park et al., "Electroless Layer Plating Process and Apparatus", Novellus Systems, Inc. U.S. Appl. No. 10/235,420, filed Sep. 30, 2002.

U.S. Office Action dated Sep. 1, 2005 for U.S. Appl. No. 10/235,420.

Sullivan et al, Electrolessly Deposited Diffusion Barriers For Microelectronics, E. J. IBM J Res Develop vol. 42, No. 4 Sep. 1998, 607-620.

Eugene J. O'Sullivan, "Electroless Deposition in Microelectronics: New Trend," Electrochemical Society Proceeding vol. 99-34, 159-171.

T. Itabashi et al., "Electroless Deposited CoWB for Copper Diffusion Barrier Metals," Hitachi Research Laboratory, IEEE, 2002, 285-287.

N. Petrov and Y. Shacham-Diamand, "Electrochemical Study of the Electroless Deposition of Co(W,P) Barrier Layers for Cu Metallization," Electrochemical Soc. Proceedings vol. 2000-27, 134-148.

Mori et al., "Metal Capped Cu Interconnection Technology by Chemical Mechanical Polishing," VMIC Conference, 1996, 487-492.

Hu et al., "Reduced Electromigration of Cu Wires by Surface Coating," Applied Physics Letters, vol. 81, No. 10, (2002), 1782-1784.

E.G. Colgan, "Selective CVD-W for Capping Damascene Cu Lines," Thin Solid Films, 262, (1995), 120-123.

Enhanced Copper Metallurgy for BEOL Application, IBM Technical Disclosure Bulletin, vol. 33, No. 5, (1990), 217-218.

Yosi Shacham-Diamand and Sergey Lopatin, "Integrated Electroless Metallization for ULSI," Elecrochimica Acta, (44 (1999) 3639-3649.

Theoretical Studies on the Electroless Metal Deposition Reaction Mechanism Group, printed from website http://www.appchem.waseda.ac.jp on Jul. 3, 2002. Published prior to the filing of this application. 3 Pages.

Wolf, Silicon Processing for the VLSI Era, Lattice Press, vol. 3, p. 648.

Office Action dated Nov. 30, 2006 from U.S. Appl. No. 10/690,084; 6 pages.

Notice of Allowance, mailed Oct. 2, 2007, from U.S. Appl. No. 10/690,084.

Mayer et al., "Pad-Assisted Electropolishing," Novellus Systems, Inc., U.S. Appl. No. 11/213,190, filed Aug. 26, 2005.

Mayer et al., "Topography Reduction and Control by Selective Accelerator Removal," Novellus Systems, Inc., U.S. Appl. No. 11/602,128, filed Nov. 20, 2006.

Allowed Claims from U.S. Appl. No. 10/690,084.

U.S. Office Action (Feb. 8, 2008) from U.S. Appl. No. 11/251,353.

Notice of Allowance, mailed on May 13, 2008 for U.S. Appl. No. 11/251,353.

Allowed Claims from U.S. Appl. No. 11/251,353.

Notice of Allowance, mailed May 13, 2008, U.S. Appl. No. 11/251,353.

Reid et al., "Capping Before Barrier-Removal IC Fabrication Method", Novellus Systems, Inc., U.S. Appl. No. 12/184,145, filed Jul. 31, 2008.

Mayer et al., "Two-Phase Plating of Cobalt Layers", Novellus Systems, Inc. U.S. Appl. No. 10/742,006, filed Dec. 18, 2003, pp. 1-32.

Koos et al., "Method for Fabrication of Semiconductor Interconnect Structure with Reduced Capacitance, Leakage Current, and Improved Breakdown Voltage", Novellus Systems, Inc. U.S. Appl. No. 10/690,084, filed Oct. 20, 2003. pp. 1-27.

U.S. Final Office Action mailed Jul. 18, 2007 from U.S. Appl. No. 11/251,353.

SanderKok.com. "Analytical Chemistry", http//home.planet.nl/-skok/ttechniques/laboratory/pka_pkb.htm.

U.S. Office Action mailed Aug. 2, 2007 from U.S. Appl. No. 10/690,084.

* cited by examiner

FABRICATION OF SEMICONDUCTOR INTERCONNECT STRUCTURE

CROSS REFERENCE TO RELATED PATENT APPLICATION

This application is a continuation-in-part claiming priority under 35 USC 120 from U.S. patent application Ser. No. 10/690,084 filed Oct. 20, 2003, titled "Method for Fabrication of Semiconductor Interconnect Structure with Reduced Capacitance, Leakage Current, and Improved Breakdown Voltage," naming Daniel A. Koos et al. as inventors. This application is also a continuation-in-part claiming priority under 35 USC 120 from U.S. patent application Ser. No. 10/742,006 filed Dec. 18, 2003, titled "Two-phase Plating of Cobalt Barrier Layers" by Steven T. Mayer and Heung L. Park, which is a continuation-in-part application claiming priority under 35 USC 120 from the above identified U.S. patent application Ser. No. 10/690,084. This application is related to U.S. application Ser. No. 10/317,373, filed on Dec. 10, 2002, entitled "Nitridation Of Electrolessly Deposited Cobalt," by Heung L. Park. Each of these references is incorporated herein by reference in its entirety for all purposes.

FIELD OF THE INVENTION

This invention pertains to methods for producing an effective capping layer for metal lines in integrated circuits. More particularly, the invention pertains to methods of selectively etching metal lines and/or vias before depositing a conductive capping layer over the metal surfaces.

BACKGROUND

The dielectric breakdown voltage current associated with metal interconnect structures is determined by the intrinsic properties of the dielectric material interspersed between the metal lines as well as extrinsic properties such as the distance between the metal lines.

As device feature sizes continue to shrink and the distance between the metals lines is reduced, it is important to control the spacing between the lines. This means close attention to patterning of the structures, the deposition of the metal, planarization of the structure and any subsequent processing. One must avoid any encroachment between adjacent lines during processing in order to preserve good electrical characteristics of the structure.

Current technology uses an inlaid metal structure where the metal lines are formed by depositing a dielectric, pattern transfer and etching of lines in the dielectric, and subsequently depositing metals into the trenches by various means. A conformal copper barrier, such as Ta or TaN is typically deposited over the entire surface by a PEVCD (plasma Enhanced Chemical Vapor Deposition) process. Typically, a copper seed layer is deposited on top of this copper barrier layer. The recesses in the structure are then filled by a "bottom-up" non-conformal plating operation. Additional copper metal (an "overburden" of a thickness typically equal to slightly more than the thickness of the dielectric layer) is plated so that large, low aspect ratio features (those not filled by the non-conformal process) are filled with metal up to the plane of the dielectric. The overburden of the metal deposition may be removed by chemical mechanical polishing (CMP), and the individual lines and vias are thereby isolated. This is a general description of the so-called "damascene" process flow.

The space between adjacent lines is determined by various features including (1) patterning and etching of the trenches into which the metal is deposited, (2) the resulting etch profile, and (3) the depth to which the metals and dielectric are polished during CMP. Note that CMP depth affects lines spacing only if the features are not completely vertical. The typical sought-after result is to have all surface topography removed and a planar surface between the metal and dielectric surfaces.

Following this planarization process, a layer of silicon nitride is deposited to encapsulate the layers and serve as a barrier to metal (primarily copper) diffusion and an etch stop for subsequent layers. Because this layer has a relatively higher dielectric constant than the surrounding low-k dielectric layer, it can add significantly to the overall capacitance experienced by the lines and interconnects, thereby having a negative impact on performance. A more recent process, which selectively deposits a metallic "capping" layer, is superior because of a reduction in line resistance. It also limits the deleterious effects of device electromigration (EM), which results from defect sites at the metal/dielectric interface.

The conductive capping layer can be deposited on the metal lines prior to the encapsulating dielectric by a spatially selective method, such as electroless plating or selective CVD. These methods are typically isotropic in nature and result in lateral as well as vertical growth of the newly deposited film. Thus, the resulting conductive capping layer may laterally spread over the dielectric layer causing adjacent metal lines to encroach one another. This gives rise to a deleterious effect on the leakage and breakdown voltage of the device.

A typical capping layer process includes the following process operations: dielectric deposition, etch to form trenches and vias, conductive barrier deposition, metal deposition, planarization, selective conductive cap deposition, dielectric barrier deposition (optional), and dielectric deposition.

The lateral growth of the capping layer reduces the effective space between the metal lines, reducing the extrinsic insulating property of the interspersed dielectric and resulting in an increase in the electric field between the metal lines. What is therefore needed is a capping method that solves the problems of low breakdown voltages and high line leakage typically encountered with conductive barrier capper layers.

SUMMARY

The present invention addresses the problems identified above by providing methods to create a capping layer which provides for an interconnect structure with reduced capacitance, leakage current, and improved breakdown voltage. It accomplishes this by etching metal from the exposed metal regions of the substrate to a position below the level of the exposed dielectric and forming a capping layer on the etched metal portions of the substrate using electroless deposition techniques. In other embodiments, the capping layer is deposited by non-electroless techniques such as PVD followed by planarization, selective CVD, and selective deposition from a supercritical solution.

In some embodiments, the exposed metal of the substrate is copper or a copper alloy, such as exposed copper lines or vias in Damascene processes. Any number of suitable metal-containing capping layer materials can be used. In preferred embodiments, the capping layer comprises a refractory metal such as cobalt or an alloy of cobalt. The exposed metal of the substrate is preferably etched to a position below the level of the exposed dielectric that is approximately equal to or lower than the target thickness of the capping layer. The capping layer is then deposited to approximately the target thickness, which is chosen such that it is thick enough to act as a diffusion barrier but not too thick as to unnecessarily increase the resistance between conductive paths on adjacent metallization layers.

The etching can be performed in any suitable manner. In some embodiments, the exposed metal is contacted with an etching solution that oxidizes a portion of the exposed metal to a metal oxide. The metal oxide metal is then removed from the surface of the substrate using a metal oxide etching agent. In other embodiments, the exposed metal is contacted with an etching solution that directly etches the exposed metal without producing an insoluble metal oxide. In yet other embodiments, the exposed metal is contacted with an oxidizing gas to produce a metal oxide and the metal oxide is then removed from the surface of the substrate using a metal oxide etching agent. An optional annealing process can be used to pretreat the exposed metal surface before etching.

In embodiments in which the exposed metal is contacted with an oxidizing etching solution, exemplary oxidizing agents include, but are not limited to, peroxides, permanganates, persulfates, and ozone solutions, preferably at a pH of at least about 5. In addition to the oxidizing agent, the etching solution may contain a corrosion inhibitor to minimize grain attacks and surface roughening of the exposed metal. Alternatively, the exposed metal may be treated with corrosion inhibitor prior etching. In addition to the oxidizing agent, the etching solution may contain a complexing agent to control the etching rate and/or a surfactant to further modulate the etch rate.

Once metal oxides are formed on the surface of the substrate, they can be removed by using any suitable technique. In some embodiments, the metal oxide is removed by using an oxide etching agent such as glycine, although any of a number of copper complexing agents may be used. In some cases, metal oxide formation and removal take place in a single solution.

In embodiments in which the exposed metal is contacted with a direct etchant and no metal oxide is formed, the etching solution may be a relatively high pH solution (e.g., a solution of tetramethyl ammonium hydroxide, ethanol amine, ammonium hydroxide and the like). In addition, the direct etching solution may contain a corrosion inhibitor, a complexing agent and/or a surfactant to further modulate the etch rate.

Any number of suitable techniques may be used to contact the substrate surface and exposed metal with the etching solution. These techniques can include, but are not limited to, dipping, spraying or using a thin film reactor.

As indicated, the etching may comprise contacting the substrate with an oxidizing gas that oxidizes the exposed metal to a metal oxide and then transferring the substrate to an aqueous solution containing a metal oxide etching agent to remove the metal oxide. The gas oxidation occurs in a suitable reaction chamber. If the oxidizing gas is oxygen, preferred temperatures are between about 200 and 300 degrees Celsius and preferable oxygen pressure is between about 50 and 180 Torr.

After the metal portions of the substrate are etched to provide newly exposed recessed metal portions of the substrate, a post-etch treatment may optionally be performed prior to forming the capping layer. In general, post-etch treatments are used to promote better adhesion of the deposited capping layer. Post-etch treatments can include those which clean the newly exposed metal surface to remove remaining metal oxides or other contaminants.

After the post-etch treatment, if implemented, a conductive capping layer is formed over the etched metal portions of the substrate using electroless deposition or other suitable technique. In some embodiments, the capping layer is formed using a two-phase method, which involves first forming a metal nucleation layer on the etched metal portions of the substrate and then forming a bulk metal layer on the metal nucleation layer. In the first phase, the metal nucleation layer is formed by using an electroless deposition solution containing metal ions (e.g., cobalt ions) and a compound (e.g., water-soluble borane compound) that assists in nucleation of cobalt on a non-cobalt surface. In the second phase, a bulk metal layer is formed using a different electroless deposition solution containing metal ions and a compound (e.g., a hypophosphite reducing agent) that facilitates autocatalytic deposition of cobalt.

The process may also include a post-deposition anneal process which, under certain circumstances, allows for at least partial mixing of dopants within the metal nucleation and bulk metal films. In other embodiments, the process also allows for the optional formation of a cobalt nitride film to further enhance the barrier properties of the cobalt capping layer. In these embodiments, the process further includes a nitriding operation to create a metal nitride layer on the bulk metal layer.

These and other features and advantages of the invention will be described in more detail below, with reference to the associated drawings.

DETAILED DESCRIPTION OF A PREFERRED EMBODIMENT

Introduction

As indicated, the present invention provides methods for selectively etching exposed metal from a substrate and forming a conductive capping layer on the etched exposed metal. The invention can be used to address problems associated with traditional methods of forming a capping layer such as interconnect line encroachment which can lead to current leakages within the interconnect and voltage breakdown of the device. Reference will be made to specific embodiments in accordance with the present invention. For instance, electroless deposition of cobalt capping layers will be used as a principal example. While the invention will be described in conjunction with these specific embodiments, it will be understood that it is not intended to limit the invention to any particular embodiment. A sampling of other deposition techniques and other capping layer materials will be provided below.

Figure 1A:
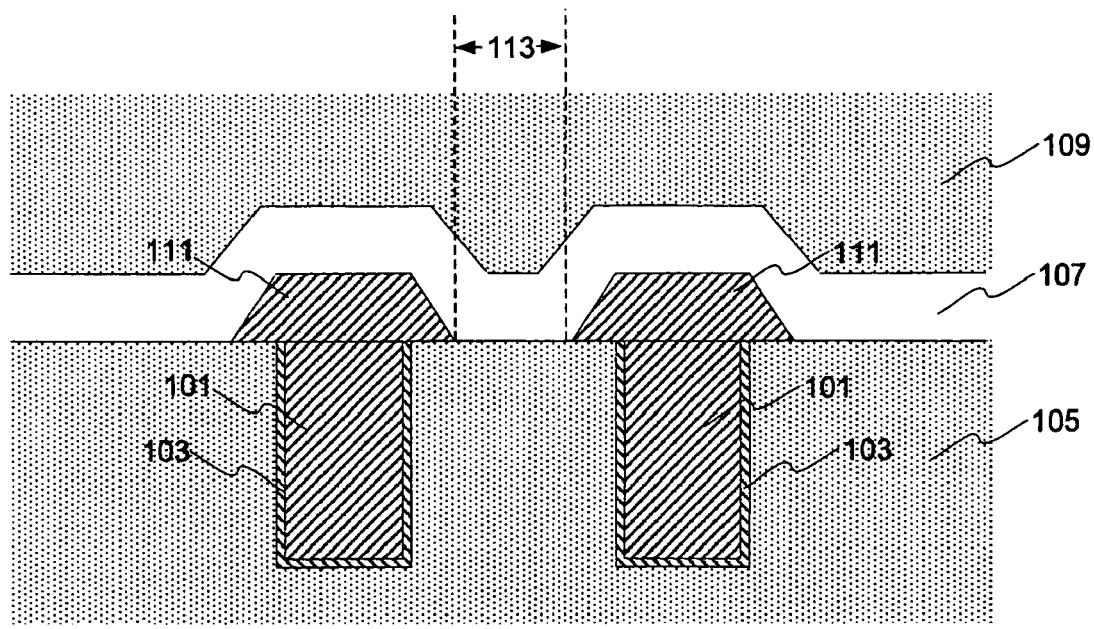
FIG. 1A is a schematic illustration of cross section of a portion of a Damascene structure with capping layers formed by using traditional methods.

FIG. 1A depicts a cross sectional view of a Damascene device using conventional methods for forming capping layers. Metal lines 101 are encapsulated with conductive barrier material 103 and surrounded by dielectric 105 such as silicon dioxide or a low-k material such as a porous silicon oxide and/or carbon containing silicon oxide. To prevent the occurrence of electromigration and to complete the encapsulation, capping layers 111 are selectively deposited over the metal lines 101. In some cases, a dielectric barrier layer 107 (e.g., silicon nitride) is additionally deposited over the surface of the wafer on the capping layers 111. A second dielectric 109 of similar composition to dielectric 105 is then deposited over the dielectric barrier layer 107. Subsequently, vias are etched through dielectric layers 107 and 109 to provide interconnects for a next metallization layer.

As shown in FIG. 1A, the portions of the capping layers 111 extending over the top of dielectric layer 105 spread on either side of the metal lines 101 and taper to the same width as the metal lines 101 at the top of the capping layers 111. This mushroom shape is a result of using traditional electroless plating methods. These traditional methods deposit material in an isotropic fashion — that is they deposit material in a lateral as well as a vertical direction. The lateral growth of the capping layer reduces the distance 113 between the metal lines 101, thereby increasing in the electric field between the metal lines 101.

The present invention addresses this problem by incorporating process operations that alter the Damascene structure prior to depositing a capping layer. Specifically, methods of the invention can be used for selectively etching exposed portions of metal lines, creating recessed regions of the surface of the substrate where the metal lines exist, followed by selectively forming the capping layer on the recessed metal regions. This process provides a structure in which the distances between the conductive capping layers are substantially the same as the distances between the metal lines and wherein the surface of the substrate is substantially horizontally planar. In other words, the mushroom structures of FIG. 1A are replaced with the columnar structures of FIG. 1B.

Figure 1B:
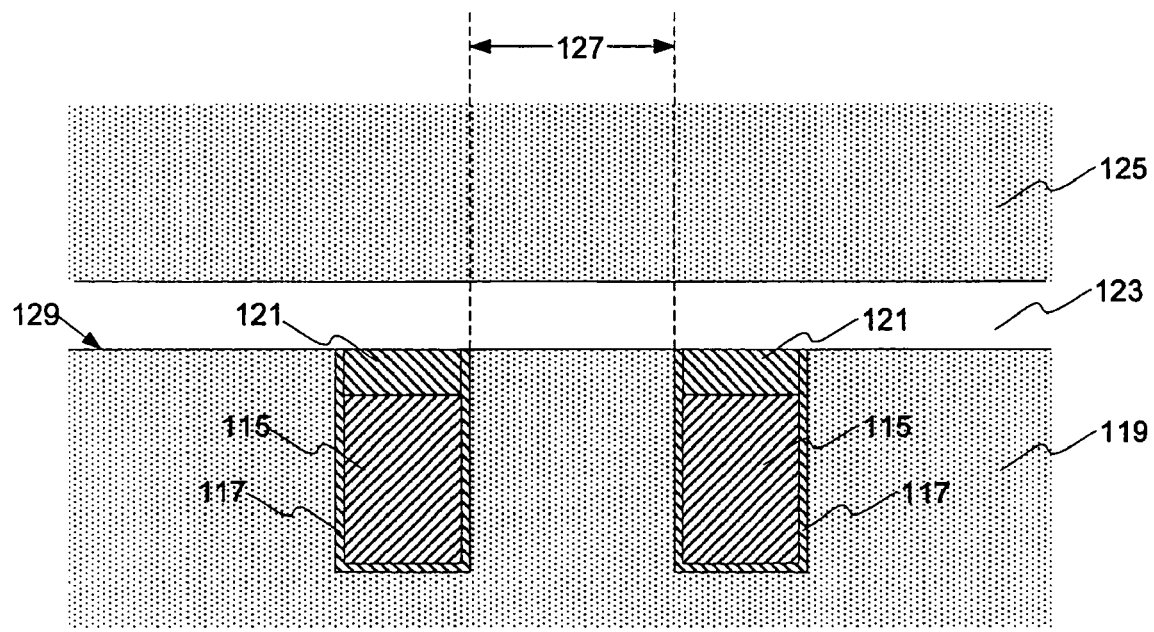
FIG. 1B is a schematic illustration of a cross section of a portion of a Damascene structure with capping layers formed by using methods in accordance with the invention.

For example, FIG. 1B depicts a cross sectional view of a Damascene device with a capping layer produced using methods of the present invention. Metal lines 115 are encapsulated with conductive barrier material 117 and surrounded by dielectric 119. To prevent the occurrence of electromigration and to complete encapsulation, capping layers 121 are selectively deposited over the metal lines 115. As indicated above, a dielectric barrier layer 123 may additionally be deposited over the surface of the wafer on the capping layers 115. A second bulk dielectric 125 is then deposited over the dielectric barrier layer 123.

As shown in FIG. 1B, the capping layers 121 are of about the same width as the metal lines 115. In addition, the top portions of the metal lines 115 are recessed below the level of the top of the surrounding dielectric 119, thereby providing space for the capping layers 121 to be deposited and resulting in a horizontally planar surface 129 at the interface with the dielectric barrier layer 123. Compared to the methods to form the structure of FIG. 1A, methods used to form the structure of FIG. 1B avoid encroachment of the conductive capping layers into the interspersed dielectric, thereby providing more robust insulation of the conductive regions of the interconnect structure and less electric field interaction between metal lines.

Example Process Flow

A detailed process flow to provide the improved interconnect structure described above will now be described. Note that this process flow is an exemplary embodiment and does not encompass the full range of possible embodiments in accordance with the invention. For example, in the processes described below for formation of the capping layer, a detailed description for the deposition of a cobalt-containing capping layer is described. It should be understood that the processes might also be applied to the formation of other conductive capping layers such as those that include palladium, ruthenium, platinum, tungsten, lead, cadmium, tantalum, tantalum nitride, nickel, titanium, titanium nitride, molybdenum, and combinations and alloys thereof. Some of these materials may be combined with relatively small amounts (up to about 10% by weight) of non-metallic compounds such as boron, phosphorus, carbon, silicon, nitrogen, and sulfur. In each case, the material should act as a barrier to the diffusion of copper.

Further, the invention extends to non-electroless deposition processes such as (a) physical vapor deposition (PVD) followed by chemical mechanical polishing or other planarization technique, (b) selective chemical vapor deposition (CVD) on the etched metal regions, (c) atomic layer deposition (ALD), (d) selective reduction of an organometallic precursor from a supercritical solution including carbon dioxide for example, and the like.

In preferred embodiments of the invention, the substrate is a semiconductor wafer containing partially fabricated integrated circuitry. In the embodiments described below, methods for selectively forming capping layers on exposed copper surfaces surrounded by dielectric material will be disclosed. Such methods are useful in Damascene structures, for example, wherein capping layers are formed on copper lines and/or vias. It should be noted, however, that methods of the invention might be implemented on any metal surface. For example, the metal surface may contain aluminum, tungsten, molybdenum or alloys thereof, as well as alloys of copper.

Figure 2:
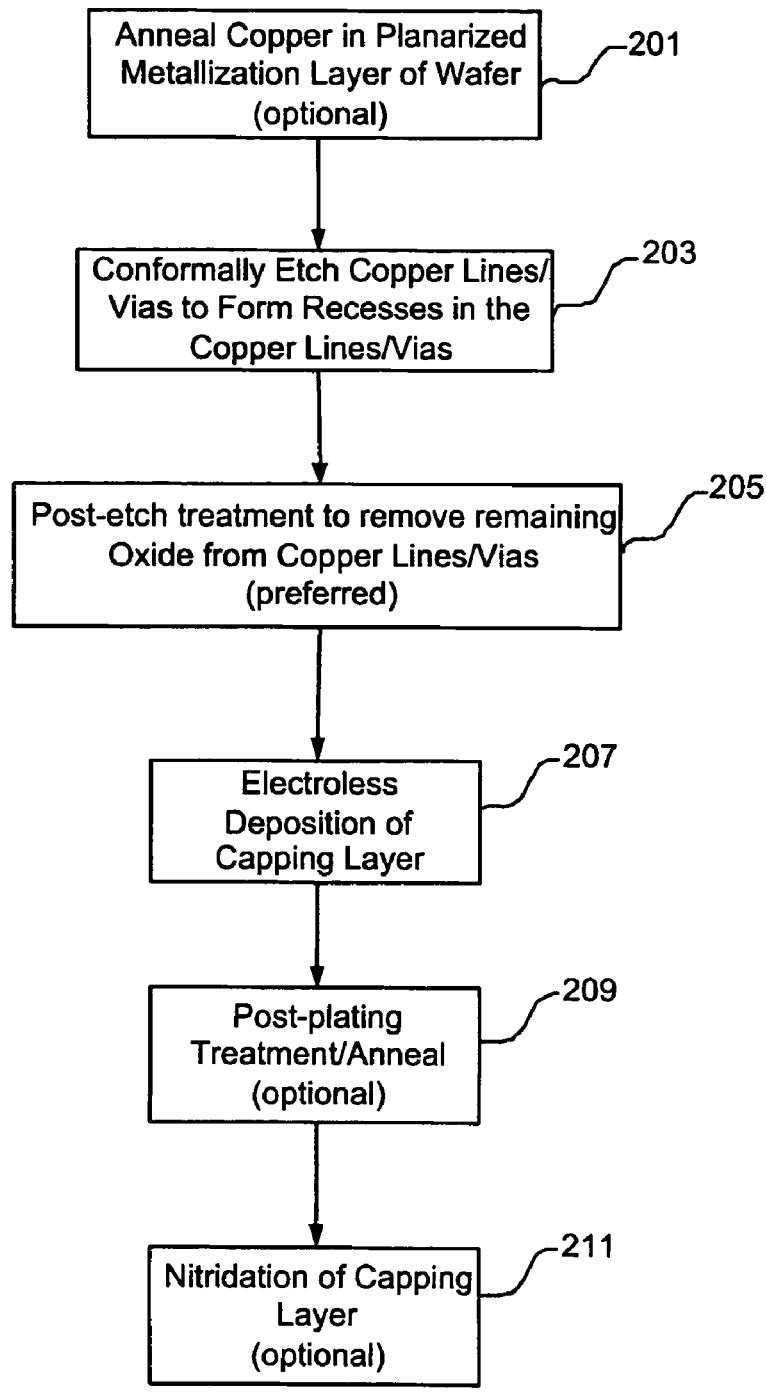
FIG. 2 is a flowchart summarizing a procedure for selectively etching a metal surface of an integrated circuit and depositing a capping layer over the metal in accordance with one embodiment of the present invention.

A typical process flow for the formation of a capping layer in accordance with this invention is illustrated in the flowchart of FIG. 2. Typically, though not necessarily, the process begins with a planarized surface of the substrate. Any suitable planarization technique, such as CMP or electroplanarization, may be used. In many cases, planarization will proceed to a point where all metal has been removed between the interconnecting lines (i.e. at a point where all the lines are electrically isolated). However, the process can also begin with a surface that has not been planarized or has been partially planarized to remove residual topography but not to the point of exposing the underlying dielectric. In this case the etchant initially removes the metal from the field area and above the lines at essentially the same rate as that over the metal until all of the copper is removed from over the field. Then the operation proceeds as in the general sequence now described.

The first operation on the planarized and cleared substrate is an optional pre-treatment of the substrate as indicated at 201. One example of such pretreatment is an anneal, i.e., a thermal process that changes the morphology of the copper and helps stabilize the crystal structure of the copper. This process serves to prevent the copper from experiencing significant mechanical stress in subsequent IC thermal processes. Preferable wafer temperatures of thermal anneal processes are between about 150 and 400 degrees Celsius. Temperatures in the higher end of this range are generally preferred, but may be unattainable for some dielectric materials that are not able to handle thermal stress. The anneal time may range between about 20 seconds and 2 hours, with longer times being required for lower temperatures. In one example, the anneal is performed in an inert atmosphere such as a forming gas ($N_2/H_2$) or under vacuum. In the case of forming gas anneals, a specific gas composition of about 97% $N_2$ and about 3% $H_2$ is used. The gas flow may be about 100 L/min dependent on the size of the chamber. In the case of vacuum anneals the vacuum may be held at about $10^{-3}$ to $10^{-5}$ Torr.

Referring back to FIG. 2, once the appropriately pretreated substrate is provided, the surfaces of the copper lines and/or vias are selectively etched (versus the dielectric and preferably both the barrier lining and the dielectric) to form recessed copper surfaces where the lines and/or vias exist. This is achieved by selectively etching the exposed surfaces of the copper. See process block 203. The amount of metal etched is preferably equal to or greater than the target thickness of the conductive capping layer that will be deposited.

Note that if the method begins with a substrate in which the dielectric field regions are not already exposed, the etching operation may proceed through the overlying copper (overburden) to expose the top of the dielectric layer and then continue from there a short distance below the newly exposed field region of the dielectric. Note that this may be appropriate in a situation where a planarization technique other than CMP is used (e.g., an electroplanarization technique) or where planarization is only partially completed.

Any suitable methods for etching the exposed metal of the substrate may be may be employed to remove a portion of the exposed metal from the surface of the substrate to produce a new exposed metal surface at a position below the level of the dielectric and to provide space for a subsequently deposited capping layer. Methods that selectively etch metal surfaces and do not substantially etch the surrounding dielectric are employed. Issues surrounding etching are described in U.S. Pat. No. 5,486,234 issued Jan. 23, 1996 to Contolini, Mayer, and Tarte, which is incorporated herein by reference for all purposes.

It should be noted that this etch process, in addition to providing space for the capping layer, can provide additional benefits toward the integrity of the interconnect structure. In particular, after an etch process, the newly exposed copper surface is typically slightly rougher than the original copper surface due the nature of etching processes, thereby potentially providing better adhesion of the capping layer to the copper. Processes for etching the metal, however, should not roughen the metal surface so much as to create pits or cavities deep enough to retain pockets of moisture during subsequent process operations.

Three general methods of selectively etching the exposed copper will now be described. Two of the methods involve a two-part process in which a copper oxide is formed followed by removal of the copper oxide from the surface of the substrate — one in which the copper oxide is formed using a wet chemical solution and one in which the copper oxide is formed using an oxidizing gas. The third method involves directly etching and removing the copper from the substrate surface in one step. Note that different etch techniques may produce different topologies on the metal surface. For example, methods that directly etch copper often result in a rougher metal surface compared to methods that form a copper oxide intermediate. Further, methods that form an oxide tend to etch uniformly across the metal surface in a feature and are essentially independent of feature size. This is because the oxidation reaction is generally not diffusion controlled, but is instead controlled by surface kinetics.

Any number of suitable techniques may be used to contact the substrate surface and exposed metal with the etching solution. These techniques can include, but are not limited to, immersing, spraying, spin on contact, and the like. In one example, apparatus for applying etching solution include those used for many EBR (edge bevel removal) or SRD (spin rinse drier) applications. An example of a suitable apparatus and methods for its use are described further in U.S. Pat. No. 6,309,981 and in U.S. Pat. No. 6,586,342 issued Jul. 1, 2003 to Mayer et al., both of which are incorporated herein by reference for all purposes. In a preferred approach, the etching solution is sprayed onto a rotating substrate that is rotated between about 20-200 rpm at ambient temperatures.

As indicated, one method involves indirectly etching by exposing the underlying metal to an etching solution that oxidizes a portion of the metal to a metal oxide (e.g., copper oxide), followed by removal of the metal oxide from the surface of the substrate using a metal oxide etching agent. Any suitable oxidizing agent capable of forming copper oxide may be used, however, it is generally preferred that a self-limiting oxidation process be used. That is, the oxidation of the copper occurs slowly and controllably. Exemplary oxidizing agents include, for example, dilute aqueous solutions of peroxides (such as hydrogen peroxide), persulfates, ozone and/or permanganates. In some embodiments, the oxidizing solution has a relatively high pH, e.g., at least about 5. In more specific cases, the solution has a pH of between about 5 and 12, and in even more specific cases, between about 6 and 10. To control the oxidizing solution pH, a buffering agent may be used, preferably one with an anion that does not complex with copper ions. Examples include tetra-alkyl ammonium and alkali metal salts of hydroxides. The oxidizing etch solution may also contain a complexing agent that complexes with the copper to control the etching rate of the acid, and/or a surfactant to further modulate the etch rate.

Generally, the copper oxidation process takes place uniformly over the features of the partially fabricated IC. Thus, the etching is independent of feature size, feature separation, position within a feature, etc. Again, this is because the oxidation rate is controlled primarily by surface reaction kinetics, as opposed to diffusion of compounds to and/or from the copper surface.

Once copper oxide is formed by the oxidizing solution, it can be removed by using any suitable copper oxide etchant. In some embodiments the copper oxide etchant selectively removes copper oxide without substantially attacking the copper crystallites or grain boundaries. Suitable copper oxide etchants include dilute acids, glycine and various copper complexing agents, for example. Exemplary acids include dissociated inorganic acids such as phosphoric acid, sulfuric acid and organic acids such as acetic acid. Appropriate pH for the etching solution is typically in the range of about 0 and 2. Suitable complexing agents may include ethylenediamine tetraacetic acid (EDTA), citric acid and salts thereof, maleic acid and salts thereof, and certain ammonium compounds known to those of skill in the art, for example.

In some embodiments, separate oxidizing and oxide etching solutions are employed. In other embodiments, a single solution is used for both oxidizing copper and removing copper oxide. By controlling the ratio of copper oxidizing agent and copper oxide etchant in such solutions, one can control the amount of oxidation and depth of the intermediate copper oxide film that is formed on the surface of the substrate. In a preferred embodiment, the solution includes between about 0.05% and 15% glycine (or copper complexing agent) by weight and between about 0.5% and 20% peroxide (e.g., $H_2O_2$) by weight. In a specific embodiment, for example, an etching solution containing about 1% (by weight) glycine and about 3% (by weight) $H_2O_2$ is used. Preferably, the single solution includes a buffering agent that maintains the pH at a specific value. Buffering agents such as acetate, carbonate, or phosphate can be selected depending on the desired pH value. More specifically, the solution may have a pH of between about 5 and 12, and in even more specific cases, between about 6 and 10. The pH can be adjusted by the addition of an appropriate agent such as an alkali metal or tetra-alkyl ammonium hydroxide.

The etching and/or oxidizing solution may additionally contain a corrosion inhibitor to minimize grain attacks and surface roughening of the exposed copper metal. Suitable corrosion inhibitors include, but are not limited to, benotriazole (BTA), thiourea, certain mercaptans, and imidazoles. Note that in addition to or instead of adding corrosion inhibitor to the etching solution, the substrate surface may be treated with a solution containing corrosion inhibitor prior to etching.

It should be noted that there exists a family of metal "polishing" solutions such as those used in metal CMP processes or mirror polishing processes that may be used in some embodiments of the present invention. These polishing solutions form an oxide and immediately etch it off the substrate. They are sometimes slurries that are sufficiently viscous to retard the transport of intermediate copper oxides (or other intermediate species) away from the substrate, thereby slowing down the formation of more intermediate copper oxides and etching away of these intermediate copper oxides. These methods provide very controlled etching so that smooth metal surfaces will result. As one example, the "polishing" solution may include ammonium cerium nitrate with nitric acid. Another example comprises inorganic substantially anhydrous acids with small amounts (e.g., about 0.2 to 5%/wt) of oxidizers (e.g., 85%+/wt phosphoric acid in water together with hydrogen peroxide or sulfuric acid with ozone). Yet another example comprises organic acids with small amounts of oxidizers (e.g., glacial acetic acid with about 1 to 5%/wt of permanganate).

A second etching method involves exposing the copper to an etching solution that directly etches the exposed copper and removes the copper metal from the substrate without producing an intermediate copper oxide. Chemicals that directly etch copper tend to preferentially etch at grain boundaries of the copper and roughening the copper surface. As described previously, to some extent roughening of the copper surface may help to promote adhesion of the capping layer but too much roughening of the copper surface can result in the development of pockets of moisture that can form copper oxide after the capping layer is deposited and deteriorate the copper interconnect structure. Therefore, in preferred embodiments, the direct etch solution preferably provides a controlled, non-aggressive etch. The etching can be controlled for example by controlling the pH of the solution (acidic solutions tend to etch more quickly) and/or by including complexing agents to the etching solution that complex with the copper.

In one embodiment, a direct etch is accomplished using a relatively high pH solution such as a solution of TMAH (tetra methyl ammonium hydroxide), ammonium hydroxide, ethanolamine, and the like. In other embodiments, the direct etching solution has a weakly acidic composition including, for example, citric acid, dilute sulfuric acid, etc., together with one or more additives that control etch rate. Examples of such additives include, but are not limited to, corrosion inhibitors such as benzotriazole and thiourea. Note that the etch rate can progress very rapidly in acidic solutions because the reaction products are generally soluble and do not limit the reaction rate. The etching solution may also contain a complexing agent, corrosion inhibitor and/or surfactant to further modulate the etch rate. Suitable complexing agents, corrosion inhibitors and surfactants may include those mentioned previously as well for indirect etching solutions. Any of a number of direct etching solutions may be used. A list of appropriate direct metal etching solutions can be found in "The Handbook of Metal Etchants", CRC Handbook of Etchants for Metals and Metallic Compounds by Perrin Walker, William H. Tam, Susan C. Smolinske, Emma Previato (Contributor), Elena Marchisotto (Contributor).

A third etching method involves exposing the copper to an oxidizing gas to produce a copper oxide, followed by transferring the substrate to a solution containing a copper oxide etching agent to remove the copper oxide. One of the advantages of using a gas oxidation process is that the amount of oxidation (i.e. depth of the copper oxide film) can be directly controlled by temperature of the reaction. The gas oxidation occurs in any of a number of suitable reaction chambers such as a conventional CVD or plasma etch reactor. Any suitable oxidizing gas that can chemically react in a self-limiting fashion with the copper to form a passivating film on the copper surface may be used. If the oxidizing gas is oxygen, preferable temperatures are between about 200 and 300 degrees Celsius and preferable oxygen pressure is between about 50 and 180 Torr. Examples, of other oxidizing gases include sulfur hexafluoride, chlorine, and the like. Note that the oxidizing gas may be wholly or partially converted to a plasma in the etching chamber. Suitable copper oxide etchants include those mentioned previously such as a dissociated acid. In a preferred process, the copper oxide is removed using dilute sulfuric acid (pH<2).

Returning to FIG. 2, after the metal portions of the substrate are etched to provide newly exposed recessed metal portions of the substrate, a post-etch treatment may optionally be implemented prior to forming the capping layer. See process block 205. When the substrate is exposed to water and air in the ambient after the etch process, the copper surfaces can readily oxidize to form a copper oxide film. Generally, this copper oxide film reduces adhesion of the subsequently deposited capping layer (although, to some extent it has been found that a little bit of copper oxide can aid to the adhesion). Post-etch treatments may be employed to remove at least a portion of the copper oxide to promote better adhesion of the deposited capping layer. Frequently, this is done by a reduction of the copper oxide back to copper metal using an acidic aqueous solution, typically having a pH of about 5 or lower, more preferably about 4 or lower. A dilute sulfuric acid and phosphoric acid have been found to work well. To address the potential problem of copper ions redistributing into the dielectric during the cleaning process, the cleaning solution preferably includes complexing agent such as EDTA.

Returning again to FIG. 2, after the post-etch treatment, if implemented, the next operation forms a conductive capping layer over the etched metal portions of the substrate using electroless deposition 207. In the case of a cobalt capping layer, the deposition process may employ a solution of cobalt ions together with an appropriate reducing agent such as N,N-dimethylamine borane (DMAB) or a source of hypophosphite ion such as ammonium hypophosphite (AHP). As is known in the art, the electroless deposition process can be activated with using a borane or using palladium displacement (e.g., using a PdCl$_2$ activator) for example. The cobalt or other electroless deposited metal may be doped with various dopants or other additives as discussed below.

In one approach, the capping layer is formed using a two-phase method, which involves forming a metal nucleation layer on the etched metal portions of the substrate and forming a bulk metal layer on the metal nucleation layer. The two phases of deposition process take place at different times, although some overlap is possible and even preferable in some embodiments. The two-phase method is described in further detail in the TWO-PHASE PLATING OF COBALT BARRIER LAYERS section of this patent.

In preferred embodiments, the capping layer comprises a refractory metal such as cobalt, although any conductive material can be used. The capping layer may also contain other materials that may be impurities or purposefully added components such as tungsten, boron, phosphorus, titanium, tantalum, zinc, cadmium, molybdenum and/or lead. These additional materials may form an alloy with the metal. Or they may serve as dopants in the metal. Or they may form a non-equilibrium mixture with the metal. Preferably, the additional materials fill or "stuff" the metal grain boundaries with amorphous material and thereby block natural diffusion paths. This of course improves the barrier properties of the metal capping layer. The metal (with or without such additional material) may exist in various morphologies such as amorphous or polycrystalline morphologies. Generally, metal layers with greater amorphous character serve as more effective diffusion barriers.

The capping layer is deposited such that it is thick enough to act as a diffusion barrier but not too thick as to create too much resistance between conductive metal layers. To some extent, a suitable thickness of the capping layer is dependent upon the morphology of the underlying metal layer. That is, if the underlying etched metal has considerable grain structures a thicker capping layer may be necessary compared to if the underlying metal grain size is small or amorphous. A preferable capping layer thickness typically ranges between about 30 and 500 Angstroms, more preferably between about 100 and 200 Angstroms.

Returning to FIG. 2, after the conductive capping layer is deposited, next an optional post-plating treatment is performed 209. The post-deposition process may be an anneal process, for example, in which the dopants from the nucleation layer and the bulk layer are permitted to intermix. For example, in the case of some embodiments where a cobalt capping layer is deposited, boron from the cobalt nucleation layer and phosphorus from the bulk cobalt layer can mix to form a CoB$_x$P$_y$ barrier capping layer. The degree of the boron/phosphorus mixing and the distribution of the boron and phosphorus in the final CoB$_x$P$_y$ capping layer will depend upon anneal process conditions (e.g., temperature and anneal time). In addition, the microstructure of the resulting mixed CoB$_x$P$_y$ capping layer can be controlled by the anneal process. Preferred substrate temperatures of anneal processes are between about 150 and 400 degrees Celsius. The anneal time may range between about 30 seconds (high temperature) and one hour (low temperature, typically in a batch mode), with longer times being required for lower temperatures, and is typically performed under vacuum.

After the post clean/anneal process, the next process operation is an optional nitridation of the metal capping layer (see FIG. 2, block 211). In certain cases, it may be desirable to further enhance the barrier properties of the metal capping layer. In these cases, this optional nitridation process can be performed. In cases where a cobalt capping layer is used, nitridation produces a cobalt nitride layer that has good barrier properties. The cobalt nitride layer may include BN$_X$ and/or PN$_X$ and/or WN$_X$, depending on the reducing agents/dopants used in the previous electroless deposition steps, and preferably has an amorphous microstructure. For a detailed description of this nitridation process, see U.S. application Ser. No. 10/317,373, which is fully incorporated by reference herein.

Experimental Data

Figure 3:
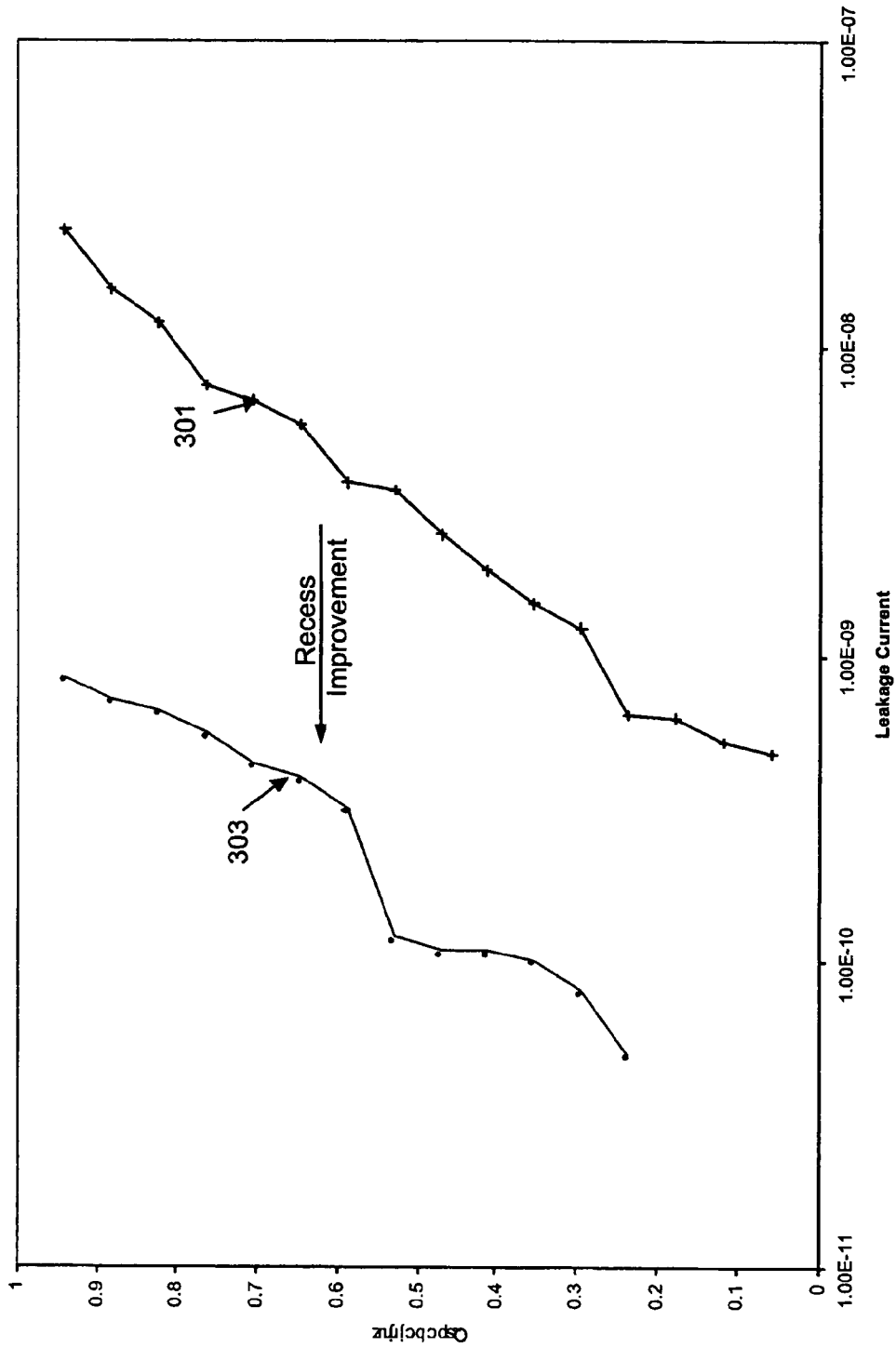
FIG. 3 is a graph comparing current leakage data of an integrated device using traditional capping layer formation methods and an integrated device using capping layer formation methods of the present invention.

FIG. 3 is a graph showing the data of the leakage currents from two different integrated circuit devices. Line 301 shows data from a wafer that was fabricated using conventional cobalt capping layer methods and line 303 shows data from a wafer that was fabricated by recessing the copper lines before depositing a cobalt capping layer in accordance with the present invention. The individual points within the lines 301 and 303 represent an individual die within the wafers that is tested for leakage current. The X axis of the graphs represents the leakage current for the device at 40 volts and the Y axis represents the cumulative probability of all the dies that are tested across the wafer. Both wafers are fabricated using the same mask pattern. As shown by the shift in the X direction of graph, the wafer fabricated using the capping layer methods of the present invention (line 303) shows reduced device leakage current compared to the wafer fabricated using conventional methods (line 301).

Two-Phase Plating of Cobalt Barrier Layers

As indicated, embodiments of the present invention provide a cobalt capping layer using electroless deposition techniques. In one plating method, the cobalt capping layer is formed by first electrolessly depositing a cobalt nucleation layer followed by an electrolessly deposition of a bulk cobalt layer. The depositions of these layers occur in different electroless baths with differing chemical compositions.

As used herein, "cobalt" refers to chemically pure cobalt as well as materials largely composed of the element cobalt but also containing any of a number of additional materials. These additional materials may be impurities or purposefully added components such as tungsten, boron, phosphorus, titanium, tantalum, zinc, cadmium, molybdenum and/or lead. These additional materials may form an alloy with the cobalt. In cases were the materials is microcrystaline, the added materials may reside at or near the grain boundaries or regions of bond strain having the effect of impeding copper diffusion. Or they may serve as dopants in the cobalt. Or they may form a non-equilibrium mixture with the cobalt (i.e., a metastable material). Preferably, the additional materials fill or "stuff" the cobalt metal grain boundaries with amorphous material and thereby block natural diffusion paths. This of course improves the barrier properties of the cobalt capping layer. The cobalt (with or without such additional material) may exist in various morphologies such as amorphous, microcrystaline or polycrystalline morphologies. Generally, cobalt layers with greater amorphous character serve as more effective diffusion barriers.

The first phase of a cobalt deposition process involves forming a nucleation layer. The process conditions (including bath composition) should promote deposition of cobalt on a copper surface (or more generally deposition of one metal on a different metal surface). The nucleation layer reaction kinetics should compare favorably to the kinetics achieved with conventional hypophosphite electroless plating compositions. In addition, the electroless deposition reaction should selectively deposit cobalt on exposed metal regions, but not on dielectric regions.

In addition to the kinetics and selectivity constraints, the material being deposited during the nucleation phase of the process should not displace the copper in the substrate. In other words, the nucleation layer deposition reaction should not be a displacement reaction — particularly not one that is corrosive. The copper atoms should remain in place and merely provide a "substrate" for the reduced capping layer metal atoms. Note that in conventional hypophosphite electroless plating, a palladium activator is used, which displaces copper during deposition. As indicated, this may result in local pitting and increased surface roughness, which can lead to electromigration problems. Palladium is also expensive, which is an additional factor of using the conventional hypophosphite electroless plating process that should be taken into account.

The second phase of the deposition process is the formation of a bulk layer over the nucleation layer. This bulk deposition process should be autocatalytic; i.e., the kinetics should favor capping layer metal deposition on a solid capping layer metal surface. In addition, the process should employ relatively inexpensive reactants such as hypophophite (e.g. ammonium hypophosphite). Further, the process should proceed rapidly and produce a high quality barrier film.

The two phases of the capping layer deposition process take place at different times, although some overlap is possible and even preferable in some embodiments. In the first phase, performed at an early time, the substrate is contacted with a first plating solution that deposits the nucleation layer. In the second phase, performed at a later time, the substrate is contacted with a second plating solution that deposits the remainder of the cobalt layer. The first and second plating solutions may be provided from separate reservoirs, or they may be prepared "on the fly" during the plating operation. Further, the substrate may be continuously contacted with a plating solution having a composition varies in time. During the first phase, the electroless plating solution has the first composition and then prior to or during the second phase, the composition changes to that of the second plating solution. The composition may vary abruptly or gradually, during a short period of time or continuously. A thin film cell may be employed to implement this embodiment (see e.g., U.S. patent application Ser. No. 10/609,518, filed Jun. 30, 2003, titled "Chemical Liquid Reaction Treatment Using Thin Liquid Layer," by Mayer et al., which is incorporated herein by reference for all purposes). Such apparatus will be described below.

Reference will now be made to one embodiment for the formation of a cobalt capping layer. Note that although the processes described below specifically refer to the formation of a cobalt capping layer, the processes may also be applied to the formation of other metal capping layers such as those that include tungsten, lead, cadmium, tantalum, nickel, titanium, molybdenum, and combinations and alloys thereof.

Example Process for Forming Cobalt Capping Layer

Figure 4:
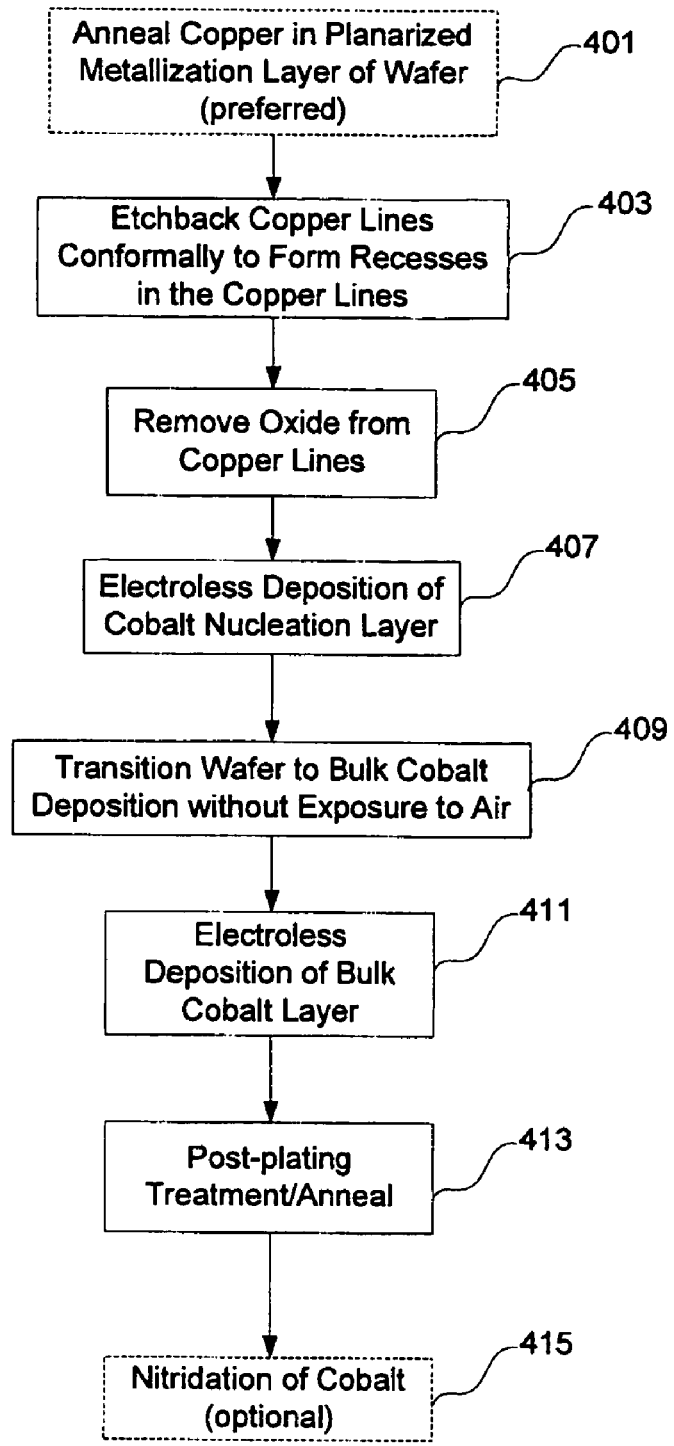
FIG. 4 is a flowchart summarizing a procedure for creating a capping layer over a copper metallization layer of an integrated circuit in accordance with one embodiment of the present invention.

A process for the formation of a cobalt capping layer employed in accordance with one embodiment of this invention is illustrated in the flowchart of FIG. 4. FIGS. 5A-5F provide cross-sectional views of a partially fabricated IC 500 at some of the different phases of the formation of the cobalt capping layer as described in the flowchart of FIG. 4. Each of the process blocks of FIG. 4 will now be described in detail with reference to accompanying cross-sectional view of FIGS. 5A-5F.

Referring specifically to the flowchart of FIG. 4, the process begins with a planarized substrate having a substantially flat surface with regions of exposed copper (or other metal). Preferably, though not necessarily, the substrate is a partially fabricated integrated circuit. In a Damascene process, for example, the copper is provided in the form of conductive lines surrounded by supporting dielectric. The flat surface of the substrate is produced by planarization using, for example, a CMP process or other suitable planarization technique.

As depicted in process block 401, the operation begins by annealing to change the morphology of the copper lines layer of substrate. Specifically, the anneal operation is a thermal treatment to stabilize the crystal structure of the copper so as to prevent the copper from experiencing significant mechanical stress in subsequent IC thermal processes. Note that this anneal process is optional in that it is not necessary to create the cobalt capping layer. Preferable wafer temperatures of thermal anneal processes are between about 150 and 400 degrees Celsius. Temperatures in the higher end of this range are generally preferred, but may be unattainable for some dielectric materials that are not able to handle thermal stress. The anneal time may range between about 20 seconds and 2 hours, with longer times being required for lower temperatures, and is typically performed under vacuum.

Figure 5A:
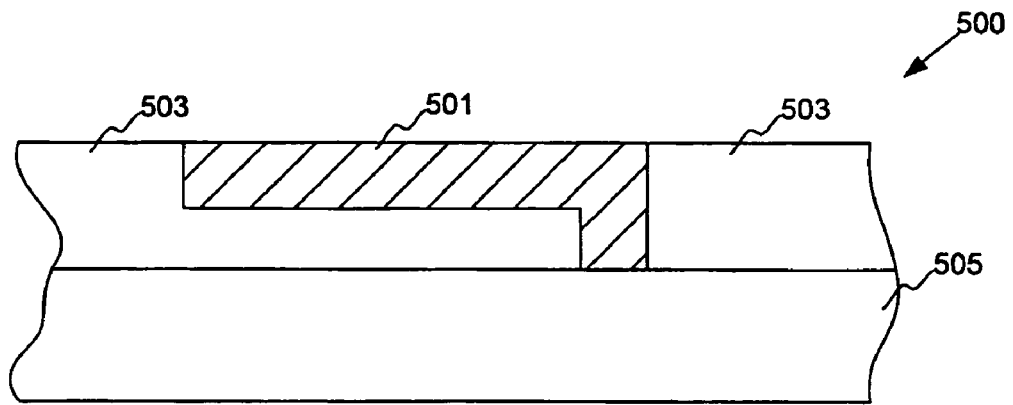
FIGS. 5A-5F are schematic illustrations of cross sections of a portion of an integrated circuit at different stages of development of a capping layer in accordance with embodiment of the present invention.

FIG. 5A illustrates a cross-sectional view of a partially fabricated IC 500 with a metalization layer formed on an underlying region of a substrate 505. The metalization layer includes a copper line 501 and surrounding dielectric material 503. Note that in this case the substrate underlying region 505 can be a layer of active devices or any one of a number of underlying metalization layers created as part of an IC stack. FIG. 5A shows the partially fabricated IC after the surface has been planarized and the copper has been suitably annealed, corresponding to process block 401 of FIG. 4.

Figure 5B:
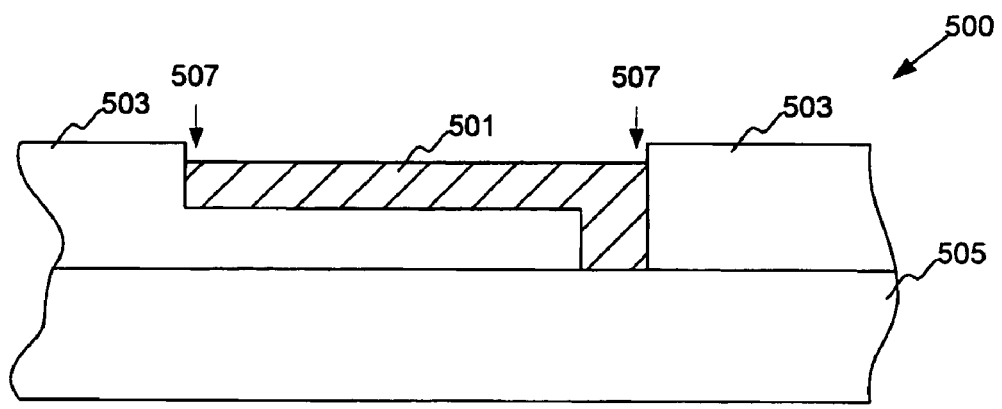

Referring again to FIG. 4, the next operation after providing an annealed and planarized wafer is a conformal etchback of the exposed portion of the copper lines to form slight recesses in the surface of the wafer where the copper lines exist. See block 403. Like the anneal operation, the etchback is an optional operation. One goal of an etchback process is to provide room for the cobalt capping layer which will be deposited over the copper lines so that, at the end of the cobalt plating step, the surface is again planar. It is also a goal of the etching step to provide a sufficently roughened copper surface to promote better cobalt adhesion. Any suitable etch process can be implemented. In one example, the etchant is a wet chemical etchant such as an aqueous solution of peroxide and glycine. Other useful etchants include nitric acid or persulfate solutions as described in U.S. Pat. No. 5,486,234 to Contolini et. al. The process should remove copper conformally, without affecting the dielectric significantly. Preferably the amount of copper removed is sufficient to create recesses of about 5 to 50 nanometers below the dielectric field regions. FIG. 5B illustrated a cross-sectional view of partially fabricated IC 500 after it has been conformally etched 507 at the surface of copper line 501. For a further discussion of appropriate etching conditions, see U.S. patent application Ser. No. 10/690,084, previously incorporated by reference.

Referring again to FIG. 4, the next operation after conformal etchback is removal of oxide from the surface of the copper lines (see process block 405). When the wafer is exposed to water and air in the ambient after the etchback process, the copper surfaces can readily oxidize forming a copper oxide film. Prior to deposition of the cobalt-capping layer, the copper oxide is preferably removed by chemical reduction to promote adhesion and optimize the quality of the cobalt layer. This is frequently performed with an acidic aqueous solution, typically having a pH of about 5 or lower, more preferably about 4 or lower. A dilute sulfuric acid has been found to work well. To address the potential problem of copper ions redistributing into the dielectric during the cleaning process, the cleaning solution preferably includes complexing agent such as EDTA.

As represented by process block 407, the next operation after copper oxide removal is electroless deposition of a cobalt nucleation layer. A cobalt nucleation layer (sometimes referred to as a "seed" layer) is typically a very thin layer of cobalt that preferably forms conformally over the copper surfaces with minimal coverage over the dielectric surfaces. Deposition of the cobalt nucleation layer takes place prior to deposition of the bulk cobalt layer. In addition, the deposition proceeds relatively easily (starts without significant delay, with a low activation energy process) and selectively on copper — in comparison to the bulk deposition process. Also the cobalt nucleation layer and bulk cobalt film may have differing compositions due to the differing compositions of their electroless deposition baths.

Initiation and formation of the seed layer is preferably rapid (e.g., requiring less than about 10 seconds). As an example, the average growth rate is typically between about 2 and 8 angstroms per second. This may be set as necessary to control the total amount of boron or other dopant in the cobalt film. Note that all boron or other dopant in the film (which is composed of both seed and bulk layer) may originate in the seed. Typically, the thickness of the nucleation layer (seed) is less than about 50 angstroms, and preferably between about 5 and 10 angstroms (i.e. only a few monolayers). If electrical contact the one or more of the plating feature can be made, progress of the process can be monitored using a reference electrode to measure the potential that indicates when a complete layer of cobalt has been deposited.

In many cases, the nucleation process is a self-limiting process in that it proceeds most rapidly on a copper surface. When the copper is covered with the cobalt nucleation layer, the deposition rate may slow and thereby limit the final thickness of the cobalt nucleation layer. This is the case when certain borane containing reducing agents such as DMAB are used, because the oxidation kinetics of the reducing agent are greater on the copper substrate than the cobalt-like nucleation film. Reducing agents with these characteristics are therefore preferred over ones without this property of the reverse behavior.

Preferably, the bath and process conditions are selected to yield a conformal cobalt (with boron) nucleation layer having a very small grain crystal structure or amorphous morphology. Because the film is so thin, a material with two-dimensional disorder and little correlation with the grain structure of the underlying copper line are desired. By nucleating with high density of nucleation (growth center) sites, one obtains a continuous deposit, substantially free of microvoids.

The concentration of boron in the film can be adjusted by the electroless deposition conditions. Most fundamentally, the ratio of cobalt ion to borane containing compound affects the boron concentration. However, other parameters have an impact as well. These include the concentration and type of complexing agent, the bath temperature and the bath flow rates. Preferred boron concentrations range between about 1 and 8% (atomic), more preferably between about 2 and 4% (atomic).

Generally, the nucleation deposition bath is an aqueous solution including a source of cobalt ions and a reducing agent (preferably a borane compound such as dimethyl amine borane or morpholine borane). The bath may include one or more other components such as a stabilizer (a catalytic poison to maintain the thermodynamically unstable bath, such as lead or cadmium), a complexing agent (prevents too much free metal ion), a buffer (to keep pH range narrow), a pH adjustor, and/or one or more surfactants.

There are many possible cobalt ion sources for use in the nucleation layer electroless plating bath. In most cases, these are soluble cobalt salts such as $CoCl_2$ (cobalt II chloride) and $CoSO_4$ (cobalt II sulfate), as well as other cobalt compounds that will be apparent to those of skill in the art. Typical concentrations of cobalt ions in the aqueous plating bath range between about 10 and 50 grams/Liter in aqueous solution, depending on the particular reagent(s) chosen, other chemical species in the electroless bath, and the electroless plating conditions.

As mentioned, the reducing agent is preferably a borane compound. Suitable borane containing reducing agents include N,N-dimethylamine borane (DMAB), as well as boron hydride, hydrazine or dibutylamine borane, morpholine borane, borane-tert-butylamine, borane-ammonia complex ($BH_3NH_3$), alkali and tetramethylamine boranes (e.g. $NaBH_4$) and other — $BH_3$ containing complexes and/or derivatives. and other borane containing reducing agents as know in the art. If DMAB is used, typical concentrations range between about 1 and 20 grams/Liter, and more preferably between about 3 and 5 grams/Liter in aqueous solution. Other reducing agents not listed can be used, with the primary requisite that they have sufficient catalytic activity on copper to initate cobalt plating on the copper surface. Preferably DMAB or other borane reducing agent is substantially the only reducing agent used in the nucleation electroless plating bath. The boron from the reducing agent is incorporated into the growing nucleation layer.

The complexing agent can be any agent that complexes cobalt ions and does not significantly interfere with the deposition reaction. Some complexing agents are also pH buffers. Examples of suitable complexing agents include ammonia, ammonium ion compounds (e.g., ammonium chloride), citrates (including citric acid monohydrate), glycine, EDTA, and maleates. The complexing agent concentration will differ depending upon the complexing agent used. If, for example, citric acid, ammonia chloride or glycine are used, typical concentrations range between about 10 and 80 grams/Liter in aqueous solution. The pH of the electroless plating solution is nominally kept basic for optimal plating conditions. As indicated, a separate pH adjustor can also be included in the electroless bath. The pH adjuster is optionally added to adjust the pH. Preferably, the pH of the electroless bath solution is maintained between about 9 and 10, preferably between about 9.2 and 9.8. One example of a suitable pH adjuster is tetramethyl ammonium hydroxide (TMAH).

If used, surfactants can serve to modify grain structure, improve wetting, improve solution stability, and help displace evolved hydrogen gas. Examples of the suitable surfactants include PEG, PPG, triton X-100, RE610, and the like. In one specific embodiment, polyethylene glycol serves as a surfactant. The "Triton" surfactants available from Rohm and Haas of Philadephia, Pa. and RE610 available from Rhone Poulenc of Cedex France have been found work as suitable surfactants. The concentration of polyethylene glycol in solution ranges up to about 1000 ppm, more preferably between about 100 and 500 ppm. Generally, the surfactant should be added in an amount sufficient to meet the desired goals (e.g. good wetting, solution stability, etc.).

Some examples of preferred baths for nucleation are presented here.

Cobalt 5 g/L $CoCl_2*6H_2O$
Buffer/Complexing agent 10 g/L Citric acid*$H_2O$
pH Adjuster: TMAH added until pH is between 9.25 and 9.80
Reducing Agent: DMAB 3 g/L
Temperature 55° C.
Cobalt 5 g/L $CoCl_2*6H_2O$
Buffer/Complexing agent 8 g/L glycine pH Adjuster: TMAH added until pH is between 9 and 9.25
Reducing agent: DMAB 4 g/L
Temperature 50° C.
Cobalt 5 g/L CoCl$_2$*6H$_2$O
Buffer/Complexing agent 8 g/L ammonium chloride
pH Adjuster: Added until pH is between 9 and 9.25
Reducing agent: DMAB 5 g/L
Temperature 50° C.

The bath temperature for deposition of the nucleation layer preferably ranges between about 20 and 90 degrees Celsius, and more preferably between about 45 and 70 degrees Celsius. Other suitable electroless bath conditions and reagents can be found in, for example, the book "Electroless Plating: Fundamentals and Applications," Glenn O. Mallory et al. editors, American Electroplaters and Surface Finishers Society, publisher (1990), which is incorporated herein by reference for all purposes.

The cobalt nucleation layer can be deposited using any one of a number of methods, including, for example, dipping (immersion), spraying the wafer with reactants, or use of a thin film reactor (as described in U.S. patent application Ser. No. 10/609,518, previously incorporated by reference). These methods typically involve heating the electroless bath and/or substrate to appropriate deposition temperatures. In preferred methods, after the wafer surface has been initially exposed to the liquid electroless plating reactants, little or no convection is used in order to accelerate nucleation of the cobalt film. It is believed that limiting convection promotes the formation of the borane reaction products at the copper surface, which initiate the nucleation process. Minimizing the fluid convection allows these products to remain on the copper surface, thereby improving nucleation.

Figure 5C:
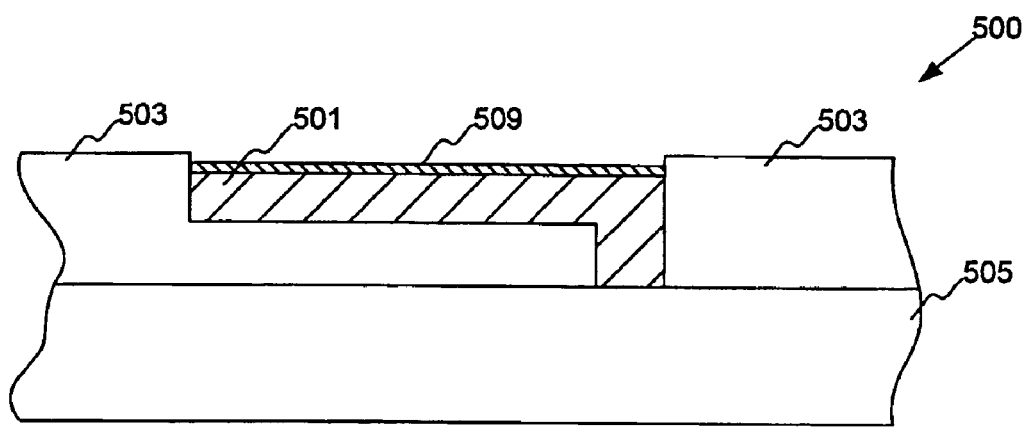

Referring to FIG. 5C, a thin cobalt nucleation layer 509 shown to have been deposited conformally and selectively over the exposed copper line 501 with minimal or no coverage on the exposed surface of dielectric material 503.

Referring again to FIG. 4, the next operation after deposition of the cobalt nucleation layer is transitioning to a different electroless bath; this one for bulk cobalt deposition. Preferably, the transition is accomplished without exposure of the wafer to ambient conditions. See block 409. Avoidance of air exposure between contact with two baths is preferred because it reduces the chance that deleterious impurities will form on or near the nucleation layer. A surface oxide, for example, can form near the newly formed cobalt nucleation film upon exposure to air, thereby hindering, and in some cases preventing, the growth of the bulk cobalt layer. It is believed that this may be due to the surface oxide interfering with the oxidation of the reducing agent used for bulk cobalt deposition.

Prevention from air exposure can be accomplished by any of a variety of different techniques. For example, one may keep the surface of the substrate wet during transfer between baths. Water, buffer, plating solution, or other solution may be maintained on the substrate surface during transfer in order to protect the exposed metal. Alternatively, the transfer can be conducted under a vacuum or in an inert atmosphere. In another case, the transition is achieved by changing the electroless bath composition from that of a cobalt nucleation bath to that of a bulk cobalt deposition bath without moving the substrate. Various reactor configurations allow for this. Generally, the plating bath chemistry must be controllable by replacing nucleation layer bath with bulk layer bath using an appropriate flow system. In a preferred embodiment, the reactor provides for periodic (rather than continuous) flow through a reaction compartment. The bath composition may change abruptly or gradually in the reaction compartment. A thin film reactor apparatus as described below, for example, can accommodate this approach.

After the wafer has been properly transferred to a bulk cobalt deposition electroless bath, the next process is an electroless deposition of a bulk cobalt barrier layer, which serves as the remainder of the cobalt capping layer 411. The bulk cobalt layer acts as the main barrier for preventing copper diffusion and is generally thicker than the cobalt nucleation layer. Generally, the bulk deposited cobalt layer is between about 2 and 10 times thicker than the nucleation layer.

Preferably, the bulk deposition process proceeds at a relatively rapid rate, on the order of 5 to 20 angstroms/second. In some cases, the bulk deposition process is an auto-catalytic process in that the deposition reaction proceeds most rapidly on a cobalt metal layer. In such cases, the bulk deposition process is not a self-limiting process, unlike some cobalt nucleation deposition processes.

As with the cobalt nucleation layer deposition, the bulk cobalt electroless plating bath will generally include a source of cobalt ions and a reducing agent provided in an aqueous solution. One preferred reducing agent is hypophosphite ion ($H_2PO_4^-$). It provides an auto-catalytic deposition process in which the cobalt deposits quite rapidly. Preferred baths contain little if any borane reducing agent. For example, it is preferred that the bath not contain more than about 1 gram/Liter of DMAB.

The bulk cobalt layer may contain a dopant or combination of dopants to provide an amorphous diffusion blocking "fill" in the cobalt microstructure grain boundaries as discussed previously. Suitable dopants include, for example, phosphorus, boron, tungsten, manganese and titanium. If phosphorus is the dopant, preferred phosphorus concentrations in the bulk cobalt layer range between about 2 and 10 atomic %, more preferably between about 4 and 8 atomic %.

The choice of reducing agent used will sometimes depend upon the desired dopant. If, for example, the desired dopant is phosphorus, hypophosphite ion is a good choice for the reducing agent. It is possible to deposit more than one type of dopant, for example both phosphorus and boron, together in this process. Obviously this requires that the electroless plating bath include both phosphorus and boron species. If phosphorus and boron are both used as dopants, preferred boron concentrations in the bulk cobalt layer range between about 2 and 10 atomic % and preferred phosphorus concentrations range between about 4 and 8 atomic %.

In the case of tungsten additives, one example of a suitable plating bath additive is ammonium tungstate (($NH_4)_2WO_4$). The amount of tungsten within the cobalt film is preferably between about 0.5% and 10% (atomic), more preferably, between about 1% and 5% (atomic), depending upon process condition. In addition, using a combination of these reducing agents and dopant additives can create a variety of doped cobalt film such combinations such as $CoB_xP_y$, $CoB_xW_z$, and $CoPyW_z$ and $CoB_xP_yW_z$ (where x, y and z are small fractions less than about 0.1)

Other additives such as complexing agents, pH adjustors, buffers, stabilizers, and surfactants may be included in the bulk cobalt plating bath. See Mallory et al. (page 499 et seq.), previously incorporated by reference.

Examples of bulk deposition bath compositions follow.

30 g/L Cobalt Sulfate, 70 g/L Citric acid (anhydrous), 60 g/L ammonium chloride, 20 g/L Ammonium hypophosphite (AHP), pH adjusted to 9 with TMAH, temperature 75-85 C.

35 g/L Cobalt Sulfate, 35 g/L Citric acid (anhydrous), 70 g/L ammonium sulfate, 40 g/L Ammonium hypophosphite (AHP), pH adjusted to 9.3 with TMAH, temperature 60-70 C.

30 g/L Cobalt Chloride, 100 g/L Citric acid (anhydrous), 50 g/L ammonium chloride, 30 g/L Ammonium hypophosphite, (AHP), 2 g/L $(NH_4)_2WO_4$, pH adjusted to 9.5 with TMAH, temperature 80-90 C.

The above baths are only a limited set of examples, and suitable bath can be found in the literature and from those skilled in the art. As with the cobalt nucleation layer deposition, any one of a number of methods may be used to deposit the bulk cobalt layer, including, for example, dipping (immersion), spraying the wafer with reactants or use of a thin film reactor.

Figure 5D:
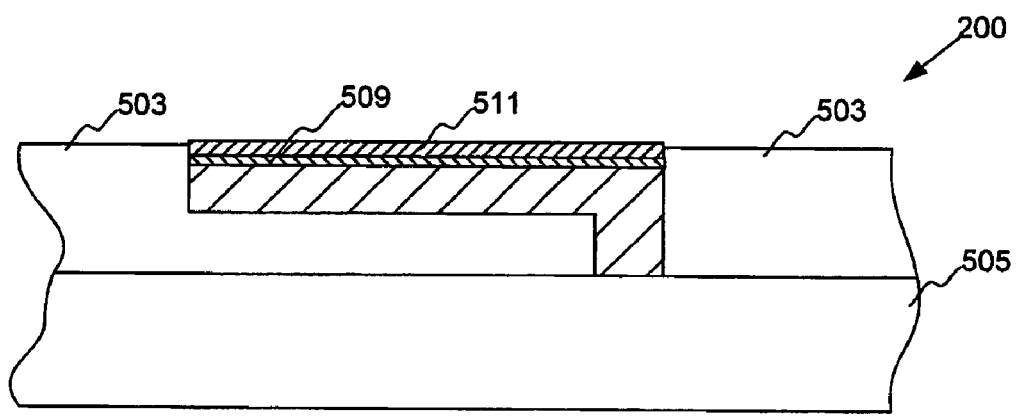

Referring to FIG. 5D, partially fabricated IC 500 now contains a bulk cobalt layer 511 formed over the cobalt nucleation layer 509 with minimal coverage over the surface of dielectric 503. Typical thicknesses for a bulk cobalt layer range between about 50 and 450 Angstroms.

As represented by process block 413 in FIG. 4, the next operation after bulk cobalt layer deposition is an optional post plating treatment and/or anneal. A variety of post plating treatments may be performed after the electroplating process including rinsing, ultrasonic (megasonic) cleaning, scrubbing (as typically performed, for example, after CMP processes), edge and back of wafer processing (e.g., edge bevel removal (EBR) and/or backside wafer cleaning), and anneal. Any number of these post anneal process can be preformed as needed. Edge and back of wafer processing, particularly EBR, are described in U.S. Pat. No. 6,309,981 issued Oct. 30, 2001 to Mayer et al., which is incorporated herein by reference for all purposes.

In some preferred processes, a post-deposition anneal process is used. In these anneal processes the dopants from the nucleation layer and the bulk layer are permitted to intermix. For example, boron from the cobalt nucleation layer and phosphorus from the bulk cobalt layer can mix to form a $CoB_xP_y$ barrier capping layer. The composition of the $CoB_xP_y$ capping layer will depend upon the boron and phosphorus concentrations and thicknesses of the previously deposited cobalt nucleation and bulk cobalt layers. The degree of the boron/phosphorus mixing and the distribution of the boron and phosphorus in the final $CoB_xP_y$ capping layer will depend upon anneal process conditions (e.g., temperature and anneal time). For example, the boron may be more concentrated at the copper-cobalt interface while the phosphorus may be more concentrated in regions above the interface in the bulk regions. In addition, the microstructure of the resulting mixed $CoB_xP_y$ capping layer can be controlled by the anneal process.

Figure 5E:
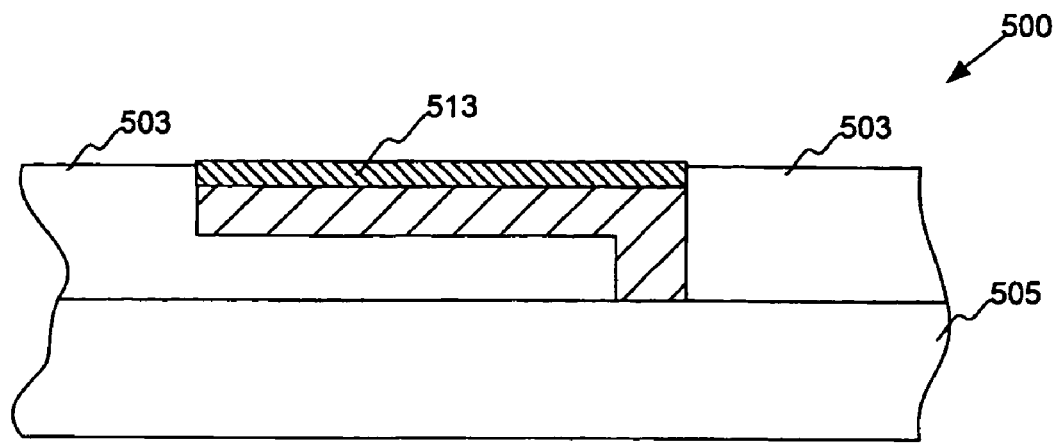

Preferred substrate temperatures of post anneal processes are between about 200 and 450 degrees Celsius. The anneal time may range between about 20 seconds and 4 hours, with longer times being required for lower temperatures, and is typically performed under a reducing atmosphere (e.g. Nitrogen/hydrogen) or a vacuum. FIG. 5E provides a cross-sectional view of the partially fabricated IC 500 after a post-deposition anneal process. After anneal, the components of the cobalt nucleation layer 509 and the bulk cobalt layer 511 of FIG. 5D can intermix to produce a more homogenous overall barrier layer 513. As indicated, a more homogeneous barrier layer may have a $CoB_xP_y$ composition. The final thickness of layer 513 will depend upon the thicknesses of the cobalt nucleation and cobalt bulk layer thicknesses. Typical final cobalt capping layer thicknesses range between about 50 and 500 Angstroms. The composition of the final cobalt capping layer 513 typically ranges between about 3 and 8 atomic % phosphorus and between about 0.1 to 6 atomic % boron. If a tungsten dopant is employed, it too may be provided in a concentrations of between about 0.1 and 2 atomic %.

After the post clean/anneal process, the next process operation is an optional nitridation of the cobalt capping layer (see FIG. 4, block 415). In certain cases, it may be desirable to further enhance the barrier properties of the cobalt capping layer. In these cases, this optional nitridation process can be performed. For a detailed description of this nitridation process, see U.S. application Ser. No. 10/317,373, which is fully incorporated herein.

In short, the nitridation process involves exposing the cobalt capping layer to a plasma which contains nitrogen species (for example, an ammonia composition or a mixture of hydrogen and nitrogen), thereby creating a cobalt nitride layer. Some techniques involve placing the semiconductor substrate on a RF electrode and exposing the cobalt surface to a nitrogen containing plasma. Suitable nitrogen containing gases to create the plasma include $N_2$, $NH_3$ and $N_2H_4$, for example. In some techniques, a RF electrode is located away from the substrate. In some techniques, a high-density plasma (HDP) is used.

Nitridation produces a cobalt nitride layer that has good barrier properties. The cobalt nitride layer may include $BN_X$ and/or $PN_X$ and/or $WN_X$, depending on the reducing agents/dopants used in the previous electroless deposition steps, and preferably has an amorphous microstructure.

Figure 5F:
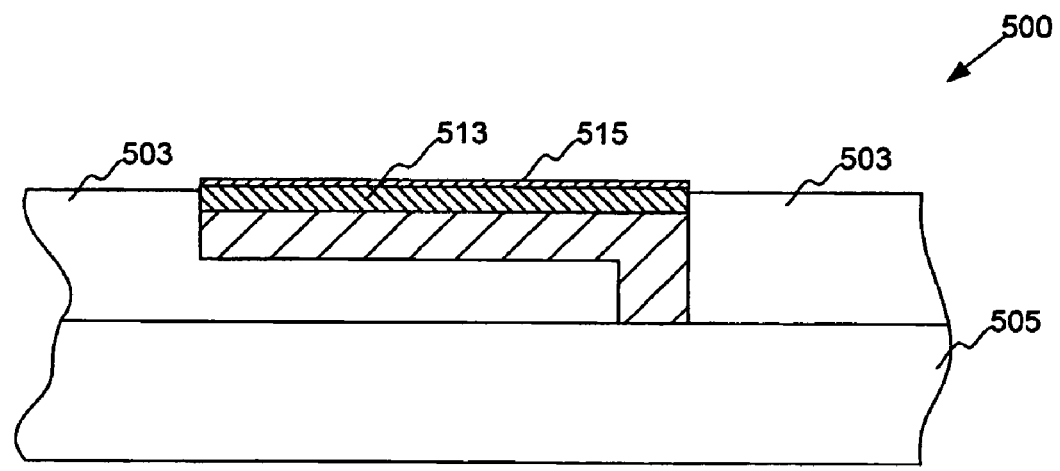

FIG. 5F illustrates a cross-sectional view of the partially fabricated IC 500 after a nitridation process. A thin cobalt nitride layer 515 is formed over the cobalt capping layer 513. The cobalt nitride layer 515 is preferably between about 20 angstroms to 400 angstroms thick, more preferably between about 20 angstroms to 200 angstroms thick (even more preferably between about 50 and 100 angstroms), depending on the nitridation and cobalt plating process conditions. The cobalt nitride layer 515 contains preferably between about 0.1% and 20% (atomic), and more preferably between about 0.1% and 5% (atomic) of nitrogen, depending upon process conditions.

Apparatus

As indicated, the electroless deposition processes can be performed by dipping (immersion), spraying, etc. Suitable apparatus for performing these processes will be well known to those of skill in the art. Examples of such apparatus are described in U.S. patent application Ser. No. 09/996,425, filed Nov. 27, 2001 by Andryuschenko et al. and titled "Electroless Copper Deposition Method for Preparing Copper Seed Layers," U.S. patent application Ser. No. 10/235,420, filed Sep. 3, 2002 by Park et al. and titled "Electroless Layer Planting Process And Apparatus," U.S. patent application Ser. No. 10/274,837, filed Oct. 18, 2002 by Minshall et al. and titled "Electroless Copper Deposition Apparatus," and U.S. patent application Ser. No. 10/272,693, filed Oct. 15, 2002 by Mayer et al. and titled "Methods And Apparatus For Airflow and Heat Management In Electroless Plating." Each of these references is incorporated herein by reference in its entirety and for all purposes.

Figure 6A:
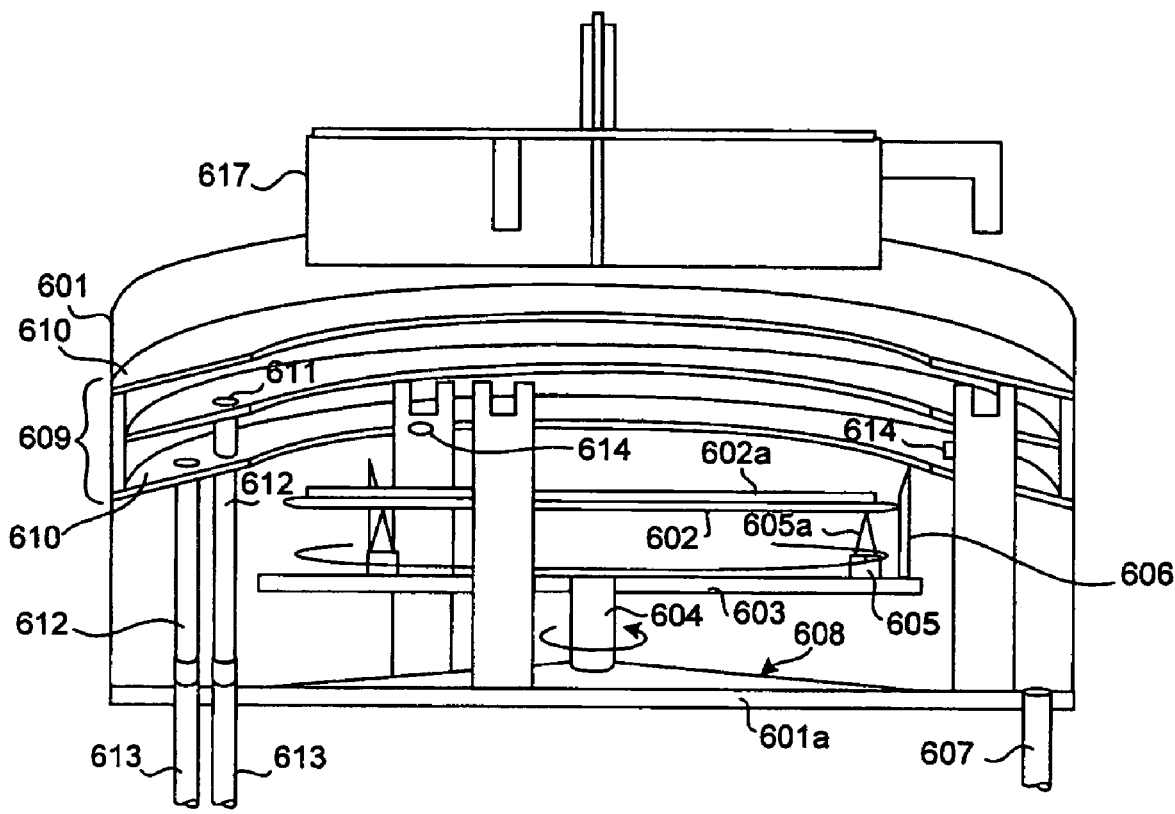
FIGS. 6A and 6B are schematic illustrations of a thin film reactor suitable for the two stage electroless deposition methods of the invention.
Figure 6B:
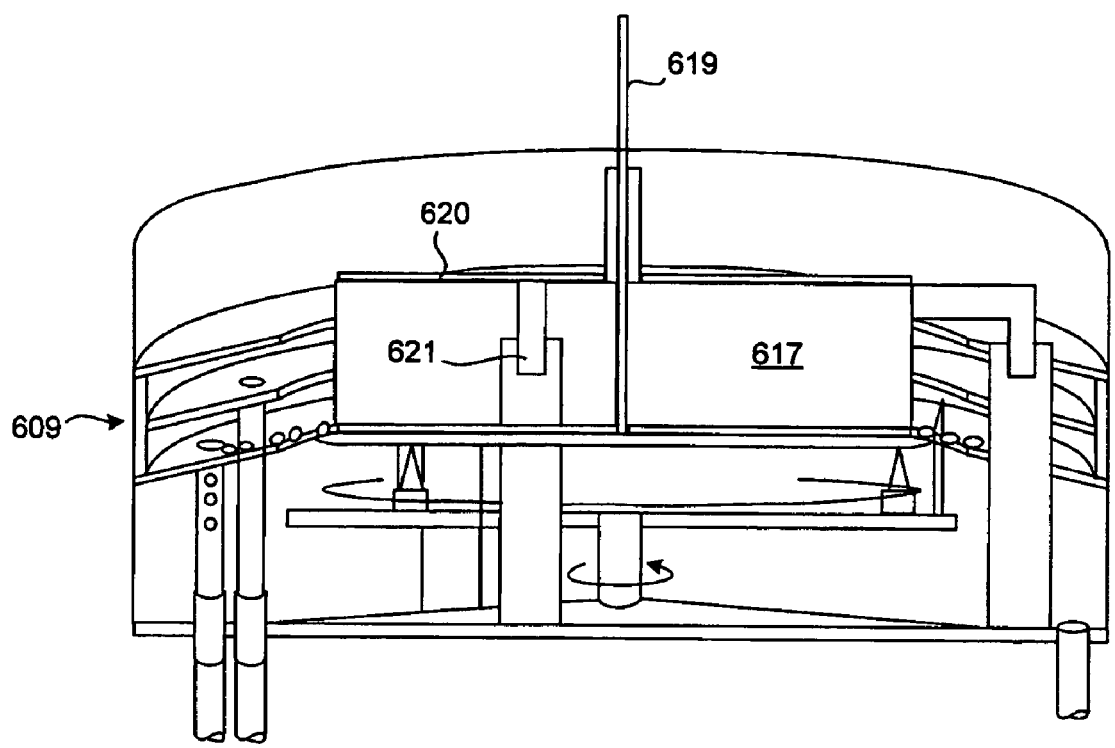

As indicated previously, a particularly preferred apparatus for conducting the deposition processes of this invention is a thin film reactor such as that described in U.S. Provisional Patent Application No. 60/392,203, now U.S. patent application Ser. No. 10/609,518, filed Jun. 30, 2003 by Mayer et. al and titled "Chemical Liquid Reaction Treatment Using Thin Liquid Layer", previously incorporated by reference. FIGS. 6A and 6B show one example of a thin film reactor suitable for use with this invention.

Referring to FIG. 6A, a reactor vessel or module contains an outer wall 301 composed of a suitable material capable of withstanding the typical operating temperature of the plating or etching operation. It also should be resistant to chemical attack from the fluid reactants that it will be exposed to during operation. Examples of suitable materials include PVC, PVDF, PTFE, PE, PP. The wafer 602 sits on a wafer chuck 603 which includes a rotary shaft 604 connected to a motor (not shown) sitting below the containment vessel's bottom 601a. The chuck includes (for example) three or more support pins 605 for holding the wafer above the chuck arms 605a. Alignment pins 606 are useful in centering the wafer during its inserting in the module from the wafer handling robot arm, and can be tapped to facilitate this operation. It also serves the function of containing the wafer from spinning out during subsequent operations occurring with rotation (pre-wetting, thin film plating or etching, rinsing, and high speed drying). Design of a chuck for use in EBR operations has been described, for example, in U.S. Pat. No. 6,537,416, entitled "Wafer Chuck for Use in Edge Bevel Removal of Copper From Silicon Wafers", issued Mar. 25, 2003. A waste drain 607 is located at the bottom of the containment vessel in 601a (the containment vessel is defined by the wall 601 and bottom 601a. Rinse waste and material not captured for recycle of reactant chemical is captured in this drain after falling off the walls of the vessel. The base of the containment vessel 601a can be sloped 608 to facilitate draining.

In a particularly preferred configuration, the reactor contains a reactant recycling diversion apparatus 609. This apparatus can consist of one or more troughs 610 located radially outside the wafer. These troughs can be raised or lowered to substantially align with the wafer plan so as to collect fluid emanating from the wafer in a radial direction (which is induced in large measure, by the rotation of the wafer surface). Connected to each of these troughs is a separate drain hole 611. The trough is preferably designed such that fluid is directed downward and into this hole (i.e. it is at the lowest location in the trough). The holes lead to the primary drain tube 612. In a preferred embodiment, the primary drain tube 312 fits inside a secondary drain tube 613 with a slightly larger diameter. The primary drain tube can move down into the secondary drain tube and have enough travel to always stay inside the secondary tube over its normal length of operational travel. The secondary tube is in fluid communication with the reactant liquid source (not shown). The reactant liquid source may contain a heat exchanger for cooling (to stop auto-catalytic reactions) or heating (preparing the chemical for subsequent recycling and reaction). The choice of these heating or cooling operations should be determined by the properties of the particular materials/chemicals being used, their stability and processing temperature. Chemistries that are highly unstable should be cool, and heated right before application to the wafer, pumped from the containment vessel, heated in line, flowed into a fluid gap through a heated treatment head, and recycled back to a cooled containment vessel via the reactant recycling diversion apparatus 609. More stable chemistries might be maintained at the operating temperature in the reactant containment vessel. In both of these cases, a "bleed and feed" of the fluid in the reactant vessel can be employed to avoid substantial changes to bath properties due to consumption of reactants in the process and auto-decomposition. Determination of the optimum liquid-source size and turnover rate is made according to reactant solution stability measurements, consistent with the liquid-source turnover time (i.e., removal rate (liter/hr)/source volume (liter)). Removal rate should include considerations of evaporation, consumption, decomposition, and collection efficiency of reactant in the recycling diversion apparatus.

The reactor may include a nozzle 614 or similar applicator of DI (deionized water), for depositing a thin film of water 602a on the wafer surface. It is preferred that this nozzle be located at the periphery of the module and spray inward onto the surface. The DI water can be used to pre-wet the wafer (removing all air and entrapped bubbles from the wafer) and to rinse the wafer surface from chemical left after deposition (either nucleation or bulk layer) or removal operations conducted with liquid-layer treatment head 617. Heated DI water can be used to improve the efficiency of these processes, and to minimize heating times when hot reactant fluids are used subsequently. A rinse nozzle directed at the backside of the wafer (not shown) for removing any incidental exposure of the surface to processing fluids can also be included. Heating the wafer from both the top and bottom with hot DI water can prepare the wafer for heated processing, improving throughput.

FIG. 6B shows the same layout as in FIG. 6A, but with the liquid-layer treatment head 617 in the engaged position over the wafer. The reactor head comprises a significant mass of a highly conducting material with a heat capacity substantially greater than that of the substrate. Generally, the (total, not specific) heat capacity of the head should be greater than 10 times that of the wafer, and the thermal conductivity of the material of the heating mass in the head should as large as possible and generally greater than 0.2 Watt $cm^{-1}$ $K^{-1}$. Examples of suitable materials are materials, which are metals at around ambient temperatures (particularly aluminum and copper). Because the material for the heating mass of the head may not be compatible with the reacting fluids (e.g., the electroless solution may had a tendency to plate onto the reacting head metal), the bottom surface of the head may be covered or coated with a thin film of a compatible material (not shown), such as PVDF, PE, PP, or PTFE coating. The film should be sufficiently thick to be continuous and to protect the head from spurious reaction and breaking under handling and typical operation, but also sufficiently thin so as to the film does not substantially reduce the heat transferring ability of the head to the wafer surface (via the thin liquid layer of reactants in the fluid gap between the head and the substrate wafer). Similarly, the port and path of injected liquid through the head is not exposed to the head thermal mass if it is susceptible to attack to avoid premature decomposition. A tube 619 made of a suitable material (e.g. plastic) carries the liquid to the treating surface of the head and to the fluid gap between the head and the wafer. In a particularly preferred embodiment, the liquid is directed to a number of exiting fluid outlet holes whose location and density are selected to improve and optimize the uniformity of the deposition reaction.

In one aspect, the treatment head is heated and maintained at an elevated temperature by one or a plurality of means. In another aspect, an electrical heating element 620 is attached to the top of, or embedded into, the treatment head. The temperature can be controlled by a regulator that senses the unit's temperature via thermocouple, thermistor, or similar device embedded in the bulk of the head. Alternatively, a heat exchange manifold with a tortuous fluid bath can interface with flow of an externally heated fluid.

The heating head rotates with the wafer, opposite to the wafer, or is stationary. Rotation enables further modification and control of the hydrodynamics and mass transfer of reactants to the wafer surface in the thin liquid layer created between the wafer and the head. The fluid gap between the wafer and the head can be maintained by means similar to those known in the construction of fluidic barring. In such an embodiment, the gap is self-regulating and enables a minimum, narrow spacing. The fluid gap size is dependent on the relative rotation rate, injected fluid flow rate, and shape of the heating head surface. Alternatively, the fluid gap can be controlled by mechanical stops 621 and the like, as depicted in FIG. 6B. The gap can be fine-tuned with a turn-screw against a hard stop, with three-position contact to a support tied to the same base as the chuck mount of the wafer. As depicted in FIG. 6B (in contrast to FIG. 6A), the reactant recycling diversion apparatus 609 is in a lowered position and liquid emanating from the wafer/head fluid gap flies into the collection trough.

Preferably, the wafer can be exposed first to the nucleation solution by mixing pre-heated reactants containing all components less the activating borane compound with ambient temperature concentrated borane. The mixing occurs just prior to application of the fluid to the thin film reactor gap and wafer surface, and heats the borane containing fluid to approximately the desired nucleation plating temperature and dilutes it to the appropriate concentration. After filling the head with reactant fluid, the flow is stopped and, with the heating head of the reactor at the operating temperature, the temperature quickly approaches the desire wafer interface temperature. Following the relatively brief (10 to 40 seconds) nucleation period, the nucleation plating solution is removed from the gap by flowing growth-phase bath material (similarly mixed just prior to flooding the reactor gap), stopping flow, and allowing the fluid to contact the wafer for the appropriate bulk film growth period (typically 40 to 120 seconds). In some cases, where the desired plating temperature for the nucleation and bulk films are different, fluid is flushed from the reactor with water and air after forming the nucleation film, and either the wafer is moved to another station with a different head set point temperature, of the wafer remains in the chuck and a different head is moved over the wafer. In either case, a large range of different bath processing conditions (in composition and temperature) can be achieved using a minimal amount of plating solution using this approach.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method of etching metal portions of a substrate containing a layer of metal and dielectric, the method comprising:

receiving the substrate containing the layer of metal and dielectric, wherein the substrate comprises metal overburden covering dielectric field regions;

at least partially completing planarization of the overburden; and etching to remove at least a portion of metal remaining exposed on the substrate after planarization by contacting the substrate with a wet etching composition at a pH in a range of between about 5 and 12, the wet etching composition consisting essentially of (i) a complexing agent for ions of the metal, wherein the complexing agent is an aminoacid; (ii) an oxidizer selected from the group consisting of peroxides, permanganates, persulfates, and ozone solution, and (iii) water, wherein the etching composition is a solution, and wherein the etching is accomplished by contacting at least the metal with said solution, wherein the contacting comprises at least one of immersing, spraying, dipping, spin on contact, and using a thin film reactor.

2. The method of claim 1, wherein the aminoacid is glycine.

3. The method of claim 1, wherein the oxidizer is hydrogen peroxide.

4. The method of claim 1, wherein the etching solution has a pH in a range of between about 6 and 10.

5. The method of claim 1, wherein the metal is copper.

6. The method of claim 1, wherein the planarization is chemical mechanical polishing.

7. The method of claim 1, wherein the planarization is an electroplanarization technique.

8. The method of claim 1, wherein said etching removes metal from a metal line and creates a recess in said line of about 5-50 nm below the dielectric field region.

9. The method of claim 1, further comprising forming a capping layer on the etched metal portions of the substrate.

10. The method of claim 9, wherein said etching removes metal from a metal line and creates a recess in said line of about 5-50 nm below the dielectric field region, prior to forming the capping layer.

11. A method of etching metal portions of a substrate containing a layer of metal and dielectric, the method comprising:

receiving the substrate containing the layer of metal and dielectric, wherein substrate comprises metal overburden covering dielectric field regions; and etching to remove at least a portion of the overburden on the substrate by contacting the substrate with a wet etching composition at a pH in a range of between about 5 and 12, the wet etching composition consisting essentially of (i) a complexing agent for ions of the metal, wherein the complexing agent is an aminoacid, (ii) an oxidizer selected from the group consisting of peroxides, permanganates, persulfates, and ozone solution, and (iii) water, wherein the etching composition is a solution, and wherein the etching is accomplished by contacting at least the metal with said solution, wherein the contacting comprises at least one of immersing, spraying, dipping, spin on contact, and using a thin film reactor.

12. The method of claim 11, wherein the aminoacid is glycine.

13. The method of claim 11, wherein the metal is copper.

14. The method of claim 11, wherein the etching solution has a pH in a range of between about 6 and 10.

15. The method of claim 11, wherein the oxidizer is hydrogen peroxide.

16. The method of claim 11, wherein said etching removes metal from a metal line and creates a recess in said line of about 5-50 nm below the dielectric field region.

17. The method of claim 11, further comprising forming a capping layer on the etched metal portions of the substrate.

18. The method of claim 17, wherein said etching removes metal from a metal line and creates a recess in said line of about 5-50 nm below the dielectric field region, prior to forming the capping layer.

19. A method of etching metal portions of a substrate containing a layer of metal and dielectric, the method comprising:

receiving the substrate containing the layer of metal and dielectric, wherein substrate comprises metal overburden covering dielectric field regions; and etching to remove at least a portion of the overburden on the substrate by contacting the substrate with a wet etching composition at a pH in a range of between about 5 and 12, the wet etching composition consisting essentially of (i) a complexing agent for ions of the metal, wherein the complexing agent is an aminoacid, (ii) an oxidizer selected from the group consisting of peroxides, permanganates, persulfates, and ozone solution, (iii) a pH adjustor and (iv) water, wherein the etching composition is a solution, and wherein the etching is accomplished by contacting at least the metal with said solution, wherein the contacting comprises at least one of immersing, spraying, dipping, spin on contact, and using a thin film reactor.

20. The method of claim 19, wherein the metal is copper.

21. The method of claim 19, wherein the aminoacid is glycine.

22. The method of claim 19, wherein the oxidizer is hydrogen peroxide.

23. The method of claim 22, wherein the pH adjustor is selected from the group consisting of tetra-alkyl ammonium hydroxide, alkali metal hydroxide, an acetate, a carbonate, and a phosphate.

24. The method of claim 19, wherein said etching removes metal from a metal line and creates a recess in said line of about 5-50 nm below the dielectric field region.

25. The method of claim 24, further comprising forming a capping layer on the etched metal portions of the substrate.

26. A method of etching metal portions of a substrate containing a layer of metal and dielectric, the method comprising:
receiving the substrate containing the layer of metal and dielectric, wherein the substrate comprises metal overburden covering dielectric field regions;
at least partially completing planarization of the overburden by chemical mechanical polishing (CMP) or electroplanarization; and
using a wet etching method different from CMP and electroplanarization, to remove at least a portion of metal remaining exposed on the substrate after planarization by contacting the substrate with a wet etching solution at a pH in a range of between about 5 and 12 and comprising (i) a complexing agent for ions of the metal, wherein the complexing agent is an aminoacid; and (ii) an oxidizer selected from the group consisting of peroxides, permanganates, persulfates, and ozone solution, wherein the etching composition is a solution, and wherein the etching is accomplished by contacting at least the metal with the etching solution, wherein the contacting comprises at least one of immersing, spraying, dipping, spin on contact, and using a thin film reactor.

27. The method of claim 26, wherein the aminoacid is glycine.

28. The method of claim 26, wherein the oxidizer is hydrogen peroxide.

29. The method of claim 26, wherein said etching removes metal from a metal line and creates a recess in said line of about 5-50 nm below the dielectric field region.

30. The method of claim 29, further comprising forming a capping layer on the etched metal portions of the substrate.

* * * * *